US012573434B2

(12) United States Patent
Nam et al.

(10) Patent No.: US 12,573,434 B2
(45) Date of Patent: Mar. 10, 2026

(54) MEMORY DEVICES PERFORMING OFFSET COMPENSATING OPERATION

(71) Applicant: Samsung Electronics Co., Ltd., Suwon-si (KR)

(72) Inventors: Kyeongtae Nam, Suwon-si (KR); Younghun Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 251 days.

(21) Appl. No.: 18/477,773

(22) Filed: Sep. 29, 2023

(65) Prior Publication Data

US 2024/0119973 A1 Apr. 11, 2024

(30) Foreign Application Priority Data

Oct. 5, 2022 (KR) ......................... 10-2022-0126828

(51) Int. Cl.
G11C 7/06 (2006.01)
G11C 5/14 (2006.01)
G11C 7/22 (2006.01)

(52) U.S. Cl.
CPC ................ G11C 7/06 (2013.01); G11C 5/147 (2013.01); G11C 7/222 (2013.01)

(58) Field of Classification Search
CPC ........... G11C 7/06; G11C 5/147; G11C 7/222; G11C 7/12; G11C 7/08; G11C 5/146; G11C 11/4091; G11C 11/4074; G11C 11/4094
USPC ........................................................ 365/207
See application file for complete search history.

(56) References Cited

U.S. PATENT DOCUMENTS

| 6,154,402 | A | 11/2000 | Akita |
| 6,594,187 | B2 | 7/2003 | Ito |
| 8,068,369 | B2 | 11/2011 | Kajigaya |
| 8,320,208 | B2 | 11/2012 | Kajigaya et al. |
| 8,422,316 | B2 | 4/2013 | Kajigaya |
| 2019/0180811 | A1* | 6/2019 | Kim ......................... G11C 7/02 |

FOREIGN PATENT DOCUMENTS

| JP | 2007073121 A | 3/2007 |
| KR | 100546316 B1 | 1/2006 |

OTHER PUBLICATIONS

"A 1.2V to 3.3V Wie Voltage-Range,Low-Power DRAM with a Charge-Transfer Presensing Scheme Masaki Tsukude, Journal of Solid-State Circuits, vol. 32, No. 11, 1997, 1721-1727".
"A Sense Amplifier Scheme with Offset Cancellation for Giga-bit DRAM Hee-Bok Kang, Journal of Semiconductor Technology and Science, vol. 7, No. 2, 2007, 67-75".

* cited by examiner

*Primary Examiner* — Huan Hoang
(74) *Attorney, Agent, or Firm* — Wolf, Greenfield & Sacks, P.C.

(57) ABSTRACT

Disclosed is a memory device that includes a memory cell array having a plurality of memory blocks, a sense amplifier connected to the plurality of memory blocks and configured to perform an offset compensating operation in response to an offset compensation signal, and an offset time adjustment circuit connected to the sense amplifier and configured to adjust an execution time of the offset compensating operation based on a comparison result of a voltage at an equalization voltage node and a reference offset voltage.

20 Claims, 21 Drawing Sheets

| PVT Condition 1 | PVT Condition 2 |
|---|---|
| VTG      0.5V+Vth1 | VTG      0.5V+Vth2 |
| VOC_ref      0.4V+Vth1 | VOC_ref      0.4V+Vth2 |
| VCM_ref      0.4V | VCM_ref      0.4V |

MEMORY DEVICES PERFORMING OFFSET COMPENSATING OPERATION

CROSS-REFERENCE TO RELATED APPLICATION

This application claims priority under 35 U.S.C. § 119 to Korean Patent Application No. 10-2022-0126828 filed on Oct. 5, 2022, in the Korean Intellectual Property Office, the disclosure of which is incorporated by reference herein in its entirety.

BACKGROUND

Embodiments of the present disclosure described herein relate to a memory device, and more particularly, relate to a memory device performing an offset compensating operation.

A semiconductor memory refers to a memory device that is implemented by using semiconductor material such as silicon (Si), germanium (Ge), gallium arsenide (GaAs), or indium phospide (InP). The semiconductor memory device is roughly classified as a volatile memory device or a nonvolatile memory device.

The volatile memory device refers to a memory device that loses data stored therein when a power is turned off. The volatile memory device includes, for example, a static random access memory (SRAM), a dynamic random access memory (DRAM), a synchronous DRAM (SDRAM) or the like. The nonvolatile memory device refers to a memory device that retains data stored therein even when a power is turned off. The nonvolatile memory device includes, for example, a read only memory (ROM), a programmable ROM (PROM), an electrically programmable ROM (EPROM), an electrically erasable and programmable ROM (EEPROM), a NAND flash memory, a NOR flash memory, a phase-change RAM (PRAM), a magnetic RAM (MRAM), a resistive RAM (RRAM), a ferroelectric RAM (FRAM), etc.

In the DRAM, a memory cell array is connected with a bit line BL and a complementary bit line BLB. When a read operation (or a refresh operation) is performed, a sense amplifier senses and amplifies a voltage difference of the bit line BL and the complementary bit line BLB. The sense amplifier can include various semiconductor elements. The semiconductor elements included in the sense amplifier may have different characteristics (e.g., a different threshold voltage) due to process, voltage and/or temperature (PVT) variations. Also, even in the same element, the threshold voltage of the corresponding element may vary depending on the change in the PVT condition (e.g., an operating temperature). This can cause an offset noise of the sense amplifier. Also, a coupling noise can occur due to the coupling between bit lines. The offset noise and the coupling noise described above may cause a decrease in an effective sensing margin of the sense amplifier. This may reduce the performance of the DRAM.

SUMMARY

Embodiments of the present disclosure provide a memory device capable of compensating for an offset accurately based on PVT variations.

According to some embodiments of the present disclosure, a memory device may include a memory cell array that includes a plurality of memory blocks, a sense amplifier connected to the plurality of memory blocks and configured to perform an offset compensating operation in response to an offset compensation signal, and an offset time adjustment circuit connected to the sense amplifier and configured to adjust an execution time of the offset compensating operation based on a comparison result of a voltage at an equalization voltage node and a reference offset voltage.

According to some embodiments of the present disclosure, a memory device may include a memory cell array that includes a plurality of memory blocks, a sense amplifier connected to the plurality of memory blocks and configured to perform an offset compensating operation in response to an offset compensation signal, an offset time adjustment circuit connected to the sense amplifier and configured to adjust an execution time of the offset compensating operation based on a comparison result of a voltage at an equalization voltage node and a reference offset voltage. and a variable voltage generator that includes a replica transistor corresponding to at least one of a plurality of transistors included in the sense amplifier, the variable voltage generator configured to generate the reference offset voltage.

According to some embodiments of the present disclosure, a memory device may include a memory cell array that includes a plurality of memory blocks, a sense amplifier that includes a first charge transfer transistor and a second charge transfer transistor, wherein the sense amplifier is connected to the memory cell array through the first charge transfer transistor and the second charge transfer transistor, a conjunction circuit connected to the sense amplifier and configured to provide a second input voltage and a transfer gate voltage to a gate of the first charge transfer transistor and a gate of the second charge transfer transistor, wherein the second input voltage is used in an operation to compensate for a difference between threshold voltages of one or more elements included in the sense amplifier, and wherein the transfer gate voltage is used in a charge transfer operation, and a variable voltage generator that includes a replica transistor corresponding to at least one of a plurality of transistors included in the sense amplifier, the variable voltage generator configured to generate the transfer gate voltage based on a threshold voltage of the replica transistor.

BRIEF DESCRIPTION OF THE DRAWINGS

The above and other aspects and features of the present disclosure will become apparent by describing in detail example embodiments thereof with reference to the accompanying drawings.

FIG. 6 is a circuit diagram illustrating an example of an offset time adjustment circuit of FIG. 4.

FIGS. 11A, 11B, and 12 are diagrams for describing a charge transfer operation during a refresh operation.

DETAILED DESCRIPTION

Below, example embodiments of the present disclosure will be described in detail with reference to the accompanying drawings.

Figure 1:
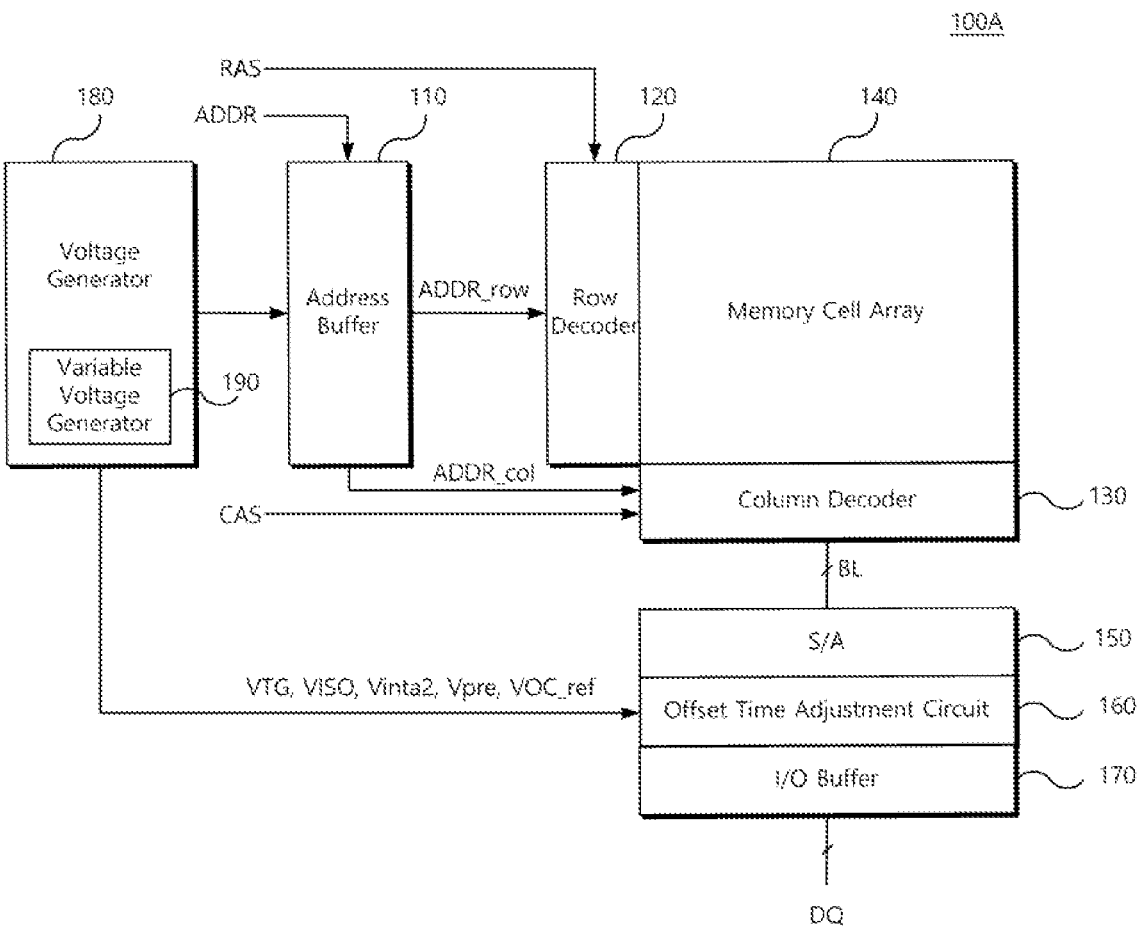
FIG. 1 is a block diagram illustrating a memory device according to some embodiments of the present disclosure.

FIG. 1 is a block diagram illustrating a memory device 100A according to some embodiments of the present disclosure.

The memory device 100A according to some embodiments of the present disclosure may support an offset compensating operation. That is, the memory device 100A may compensate for an offset of elements included in the sense amplifier. In particular, to accurately compensate for the offset of the elements in the sense amplifier due to the PVT variations, the memory device 100A according to some embodiments of the present disclosure may adjust an execution time in the offset compensating operation or may adjust a voltage level provided to a gate of a charge transfer transistor. As such, the offset may be accurately compensated for, and the effective sensing margin may increase.

Referring to FIG. 1, the memory device 100A may be a storage device that is based on a semiconductor element. For example, the memory device 100A may include a random access memory (RAM) such as a dynamic random access memory (DRAM), a synchronous DRAM (SDRAM), a static random access memory (SRAM), a double date rate (DDR) SDRAM, DDR2 SDRAM, DDR3 SDRAM, a phase-change RAM (PRAM), a magnetic RAM (MRAM), or a resistive RAM (RRAM). The memory device 100A may output data through data lines DQ in response to an address ADDR and control signals RAS and CAS received from an external device (e.g., a memory controller). The memory device 100A may include an address buffer 110, a row decoder 120, a column decoder 130, a memory cell array 140, a sense amplifier 150, an offset time adjustment circuit 160, an input/output buffer 170, and a voltage generator 180.

The address buffer 110 may receive the address ADDR from the external device (e.g., a memory controller). The address ADDR may include a row address ADDR_row indicating a row of the memory cell array 140 and a column address ADDR_col indicating a column of the memory cell array 140. The address buffer 110 may provide the row address ADDR_row to the row decoder 120. The address buffer 110 may provide the column address ADDR_col to the column decoder 130.

The row decoder 120 may select one of a plurality of word lines connected with the memory cell array 140. For example, the row decoder 120 may receive the row address ADDR_row from the address buffer 110. The row decoder 120 may select one word line corresponding to the row address ADDR_row from among the plurality of word lines. The row decoder 120 may activate the selected word line in response to the control signal RAS.

The column decoder 130 may select one of a plurality of bit lines BL connected with the memory cell array 140. For example, the column decoder 130 may receive the column address ADDR_col from the address buffer 110. The column decoder 130 may select one bit line corresponding to the column address ADDR_col from among the plurality of bit lines BL. The column decoder 130 may activate the selected bit line in response to the control signal CAS.

The memory cell array 140 may include a plurality of memory cells. The plurality of memory cells may be respectively located at intersections of the plurality of word lines and the plurality of bit lines BL. The plurality of memory cells may be connected with the plurality of word lines and the plurality of bit lines BL. The plurality of memory cells may be provided in the form of a matrix. The plurality of word lines may be connected with rows of memory cells of the memory cell array 140. The plurality of bit lines BL may be connected with columns of memory cells of the memory cell array 140.

The sense amplifier 150 may be connected with the plurality of bit lines BL connected with the memory cell array 140. The sense amplifier 150 may sense a voltage change of a bit line activated from among the plurality of bit lines BL and may amplify and output the sensed voltage change.

In some embodiments of the present disclosure, the sense amplifier 150 may perform the offset compensating operation. Herein, the offset may refer to a difference between characteristics (e.g., a difference between threshold voltages) of elements included in the sense amplifier 150. For example, the sense amplifier 150 may include the charge transfer (CT) transistor and a bit line sensing amplifier unit. The sense amplifier 150 may compensate for the offset through the diode connection in which a gate and a drain of the CT transistor are electrically connected with each other.

The offset time adjustment circuit 160 may be connected with the sense amplifier 150. The offset time adjustment circuit 160 may receive various kinds of necessary voltages (e.g., VTG, VISO, Vinta2, Vpre, and VOC_ref) from the voltage generator 180 and may provide the received voltages to the sense amplifier 150.

In some embodiments of the present disclosure, the offset time adjustment circuit 160 may adjust an execution time of the offset compensating operation depending on an offset level. For example, the offset time adjustment circuit 160 may receive a reference offset voltage VOC_ref from a variable voltage generator 190. An offset change according to the PVT variations may be applied to the reference offset voltage VOC_ref. For example, the voltage level of the reference offset voltage VOC_ref may vary depending on the offset level according to the PVT variations. The offset time adjustment circuit 160 may adjust the execution time of the offset compensating operation of the sense amplifier 150 based on a result of comparing the reference offset voltage VOC_ref and the voltage level of an equalization voltage node VPEQ. As the execution time of the offset compensating operation is adjusted depending on the offset level, the offset may be accurately compensated for.

Alternatively, in some embodiments of the present disclosure, the offset time adjustment circuit 160 may receive a transfer gate voltage VTG from the variable voltage generator 190. When a charge transfer operation is performed, the offset time adjustment circuit 160 may provide the transfer gate voltage VTG to the charge transfer transistor of the sense amplifier 150. The offset change according to the PVT variations may be applied to the transfer gate voltage VTG. For example, the voltage level of transfer gate voltage VTG may vary depending on the offset level according to the PVT variations. As the voltage level of the transfer gate voltage VTG is adjusted depending on the offset level, the offset may be accurately compensated for.

The input/output buffer 170 may output data to the external device through the data lines DQ, based on the voltage amplified by the sense amplifier 150.

The voltage generator 180 may generate various kinds of voltages necessary for the operation of the memory device 100A. For example, the voltage generator 180 may generate voltages (e.g., VTG, VISO, Vinta2, Vpre, and VOC_ref) necessary for the reference operation, so as to be provided to the offset time adjustment circuit 160.

In some embodiments of the present disclosure, the voltage generator 180 may include the variable voltage generator 190, and the variable voltage generator 190 may generate a variable voltage to which the offset according to the PVT variations is applied and may provide the variable voltage to the offset time adjustment circuit 160. For example, the variable voltage generator 190 may generate the reference offset voltage VOC_ref and/or the transfer gate voltage VTG having the voltage level varying depending on the offset level and may provide the reference offset voltage VOC_ref and/or the transfer gate voltage VTG to the offset time adjustment circuit 160.

As described above, the memory device 100A according to some embodiments of the present disclosure may adjust the time necessary to perform the offset compensating operation or may adjust the voltage level provided to the gate of the charge transfer transistor. As such, the offset may be accurately compensated for, and the effective sensing margin may increase.

Figure 2:
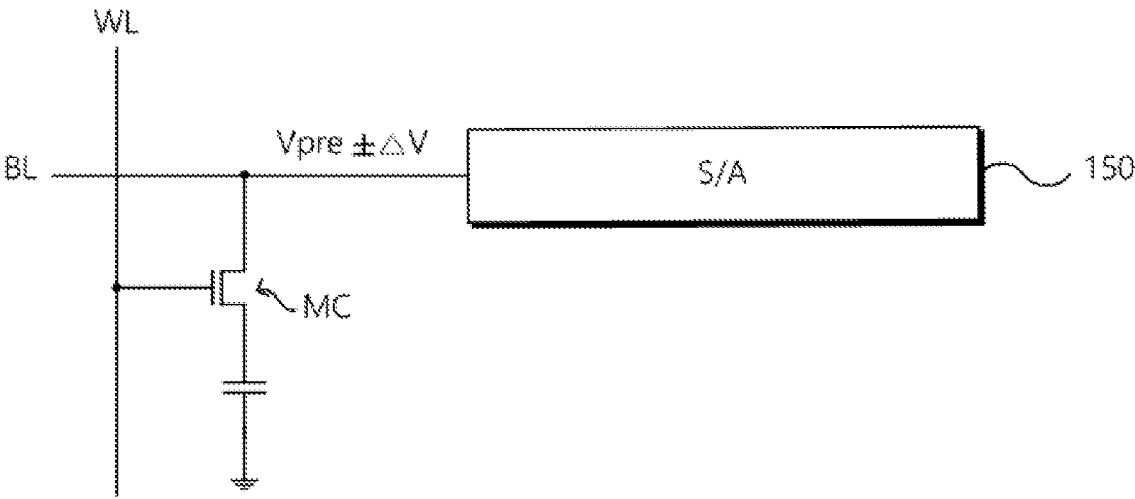
FIGS. 2 and 3 are diagrams for describing a bit line voltage sensing operation of a sense amplifier illustrated in FIG. 1.
Figure 3:
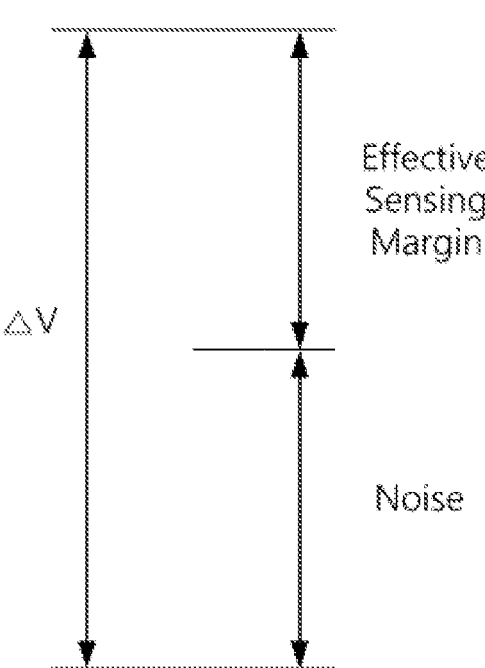

FIGS. 2 and 3 are diagrams for describing a bit line voltage sensing operation of the sense amplifier 150 illustrated in FIG. 1. For convenience of description, the remaining components other than the sense amplifier 150, the bit line BL, the word line WL, and the memory cell MC are omitted. Also, below, the present disclosure will be described based on the refresh operation of the memory device 100A. However, the present disclosure is not limited thereto. For example, the present disclosure may be applied to the read operation of the memory device 100A.

Referring to FIGS. 1 to 3, the memory device 100A may perform the refresh operation based on a charge amount of a capacitor included in the memory cell MC. First, the bit line BL connected with the memory cell MC is precharged with the precharge voltage Vpre. Next, as the word line WL is activated, the charge sharing may be made between charges of the bit line BL charged with the precharge voltage Vpre and charges of the capacitor of the memory cell MC. A voltage VBL of the bit line BL may decrease or increase as much as a voltage variation $\Delta V$ by the charge sharing.

The sense amplifier 150 may sense and amplify the voltage variation $\Delta V$. In this case, due to the noise such as a sense amplifier offset noise, the effective sensing margin of the sense amplifier 150 may be determined as illustrated in FIG. 3. That is, when the voltage variation $\Delta V$ is smaller than or equal to a given level, the sense amplifier 150 may fail to sense the voltage variation $\Delta V$ of the bit line BL.

To reduce the noise such as a sense amplifier offset noise, the memory device 100A according to some embodiments of the present disclosure may perform the offset compensating operation. In particular, in consideration of the offset change according to the PVT variations, the memory device 100A according to some embodiments of the present disclosure may adjust the execution time of the offset compensating operation or may adjust the voltage level provided to the gate of the charge transfer transistor. As such, the offset may be accurately compensated for, and the effective sensing margin may increase.

Figure 4:
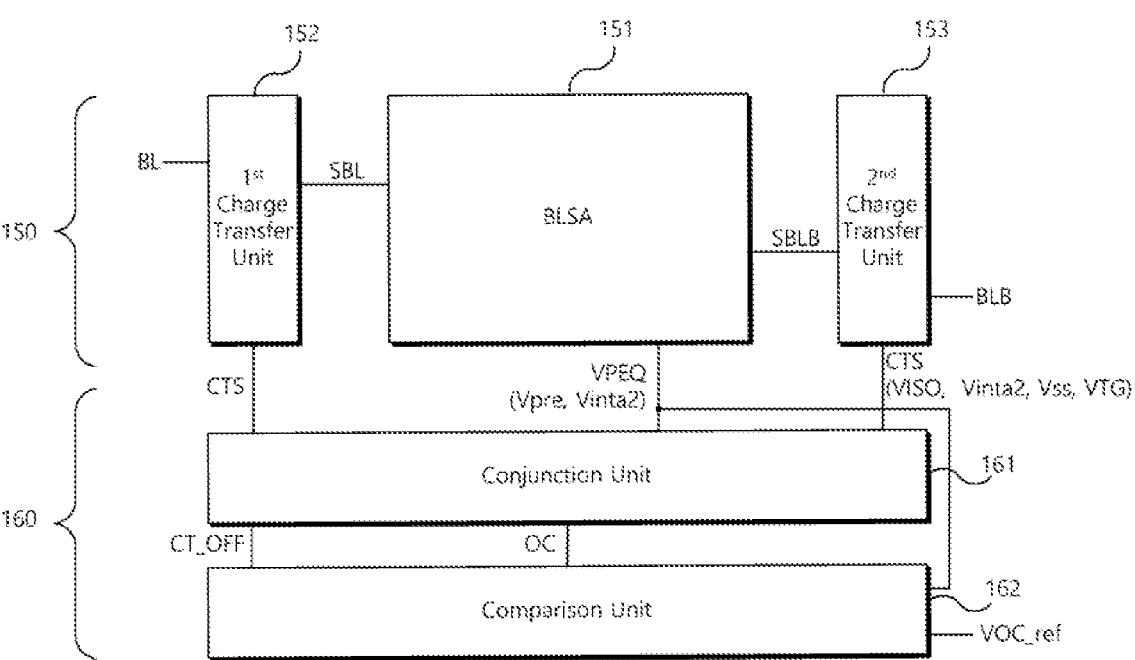
FIG. 4 is a block diagram illustrating an example of a sense amplifier and an offset time adjustment circuit of FIG. 1, according to some embodiments of the present disclosure.

FIG. 4 is a block diagram illustrating an example of the sense amplifier 150 and the offset time adjustment circuit 160 of FIG. 1, according to some embodiments of the present disclosure.

Referring to FIG. 4, the sense amplifier 150 may include a bit line sensing amplifier (BLSA) unit 151, a first charge transfer unit 152, and a second charge transfer unit 153.

The bit line sensing amplifier unit 151 may receive voltages necessary for the refresh operation from the offset time adjustment circuit 160. For example, the bit line sensing amplifier unit 151 may be connected with the offset time adjustment circuit 160 and may share an equalization voltage node VPEQ. The bit line sensing amplifier unit 151 may receive the voltages necessary for the refresh operation through the equalization voltage node VPEQ. The bit line sensing amplifier unit 151 may sense and amplify a voltage difference of the bit line BL and the complementary bit line BLB. For example, the bit line sensing amplifier unit 151 may sense a voltage change between the bit line BL and the complementary bit line BLB. The bit line sensing amplifier unit 151 may also be referred to as a bit line sense amplifier 151.

In some embodiments of the present disclosure, the voltage level of the equalization voltage node VPEQ may vary depending on an operating mode of the refresh operation. For example, the refresh operation may include a precharge operation, an offset compensating operation, a charge sharing operation, a charge transfer operation, and a restoring operation. The precharge voltage Vpre or a second input voltage Vinta2 may be provided to the equalization voltage node VPEQ depending on an operating mode of the refresh operation. However, the present disclosure is not limited thereto. For example, one of the precharge voltage Vpre, the second input voltage Vinta2, an isolation voltage VISO, and/or the transfer gate voltage VTG may be provided to the equalization voltage node VPEQ depending on an operating mode of the refresh operation.

Each of the first and second charge transfer units 152 and 153 may receive a charge transfer signal CTS from the offset time adjustment circuit 160. In response to the charge transfer signal CTS, the first charge transfer unit 152 may electrically connect the bit line BL and a sensing bit line SBL or may disconnect the bit line BL from the sensing bit line SBL. In response to the charge transfer signal CTS, the second charge transfer unit 153 may electrically connect the complementary bit line BLB and a complementary sensing complementary bit line SBLB or may disconnect the complementary bit line BLB from the complementary sensing complementary bit line SBLB.

In some embodiments of the present disclosure, the voltage level of the charge transfer signal CTS may vary depending on each operating mode of the refresh operation. For example, depending on each operating mode of the refresh operation, the voltage level of the charge transfer signal CTS may be one of voltage levels of the isolation voltage VISO, the second input voltage Vinta2, a ground voltage Vss, and/or the transfer gate voltage VTG.

As described above, the bit line sensing amplifier unit 151 of the sense amplifier 150 according to some embodiments of the present disclosure may receive one or more voltages for the refresh operation from the offset time adjustment circuit 160 through an equalization voltage node VPEQ. As such, the number of elements constituting the bit line sensing amplifier unit 151 may decrease, and thus, a size of the sense amplifier 150 may be decrease.

The offset time adjustment circuit 160 may include a conjunction unit 161 and a comparison unit 162.

The conjunction unit 161 may be connected with the first and second charge transfer units 152 and 153 through the charge transfer signal CTS and may be connected with the bit line sensing amplifier unit 151 through the equalization voltage node VPEQ. The conjunction unit 161 may provide one or more voltages for the refresh operation to the sense amplifier 150 through the charge transfer signal CTS and the equalization voltage node VPEQ. The conjunction unit 161 may also be referred to as a conjunction circuit 161 and may be implemented by software, hardware, or a combination thereof.

The conjunction unit 161 may receive an offset compensation signal OC and/or a first charge transfer off signal (hereinafter referred to as a "first CT off signal") CT_OFF from the comparison unit 162. In response to the offset compensation signal OC and/or the first CT off signal CT_OFF, the conjunction unit 161 may provide the sense amplifier 150 with voltages for an offset compensating operation.

The comparison unit 162 may receive the reference offset voltage VOC_ref from the variable voltage generator 190 (refer to FIG. 1) and may be connected with the equalization voltage node VPEQ. When the offset compensating operation is performed, the comparison unit 162 may compare the voltage level of the reference offset voltage VOC_ref and the voltage level of the equalization voltage node VPEQ and may control the offset compensation signal OC and/or the first CT off signal CT_OFF based on the comparison result. As such, the execution time of the offset compensating operation may be adjusted based on the offset level according to the PVT variations. The comparison unit 162 may also be referred to as a comparison circuit 162 and may be implemented by software, hardware, or a combination thereof.

For example, when the variation in the threshold voltages of the elements according to the PVT variations is large, the increment of the voltage level of the reference offset voltage VOC_ref may be large. In this case, the offset compensation signal OC may maintain a logic high state for a relatively long time. This may mean that the offset compensating operation in the sense amplifier 150 is performed for a relatively long time.

As another example, when the variation in the threshold voltages of the elements according to the PVT variations is small, the increment of the voltage level of the reference offset voltage VOC_ref may be small. In this case, the offset compensation signal OC may maintain a logic high state for a relatively short time. This may mean that the offset compensating operation in the sense amplifier 150 is performed for a relatively short time.

As described above, the offset time adjustment circuit 160 according to some embodiments of the present disclosure may adjust the execution time of the offset compensating operation based on the offset level according to the PVT variations; in this case, the offset may be accurately compensated for, and the effective sensing margin may increase.

In FIGS. 1 and 4, an example in which the offset time adjustment circuit 160 is implemented to be physically separated from the row decoder 120 is illustrated. However, the present disclosure is not limited thereto. For example, the offset time adjustment circuit 160 may be implemented within the row decoder 120. Alternatively, the offset time adjustment circuit 160 may be implemented together with one of the address buffer 110, the column decoder 130, and/or the input/output buffer 170.

Figure 5:
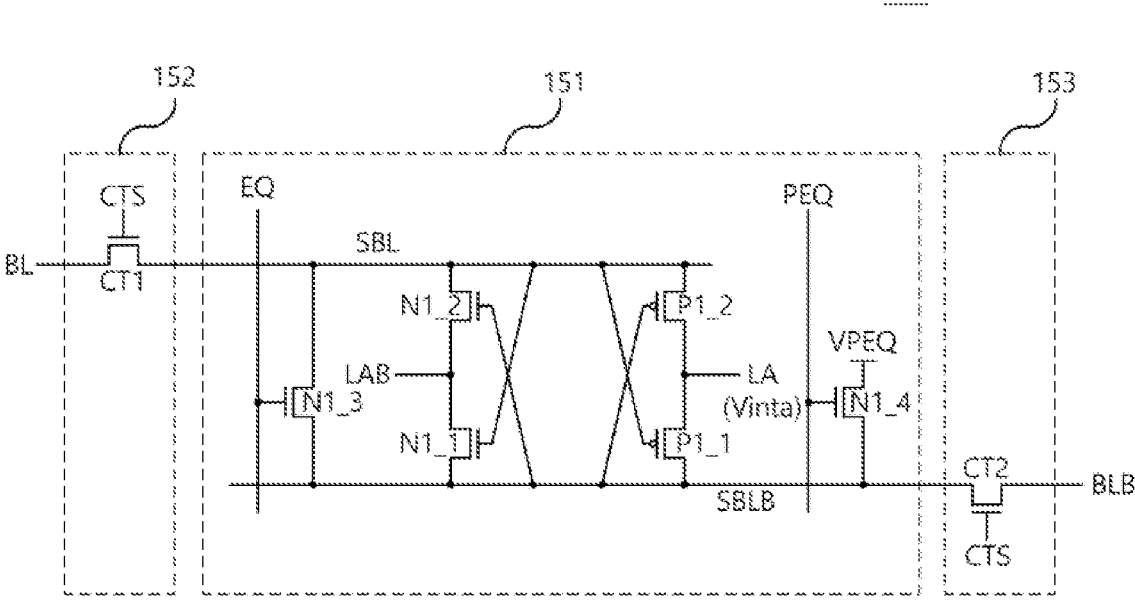
FIG. 5 is a circuit diagram illustrating an example of a sense amplifier of FIG. 4.

FIG. 5 is a circuit diagram illustrating an example of the sense amplifier 150 of FIG. 4.

Referring to FIG. 5, each of the first and second charge transfer units 152 and 153 may be implemented with one NMOS transistor. For example, the first charge transfer unit 152 may include a first charge transfer transistor CT1, and the first charge transfer transistor CT1 may electrically connect the bit line BL and the sensing bit line SBL in response to the charge transfer signal CTS. The second charge transfer unit 153 may include a second charge transfer transistor CT2, and the second charge transfer transistor CT2 may electrically connect the complementary bit line BLB and the complementary sensing bit line SBLB in response to the charge transfer signal CTS.

The bit line sensing amplifier unit 151 may include a plurality of NMOS transistors and a plurality of PMOS transistors.

In detail, a (1_1)-th NMOS transistor N1_1 may include a first end connected with the complementary sensing bit line SBLB, a second end connected with a second sensing control signal LAB, and a gate connected with the sensing bit line SBL. A (1_1)-th PMOS transistor P1_1 may include a first end connected with the complementary sensing bit line SBLB, a second end connected with a first sensing control signal LA, and a gate connected with the sensing bit line SBL.

A (1_2)-th NMOS transistor N1_2 may include a first end connected with the sensing bit line SBL, a second end connected with the second sensing control signal LAB, and a gate connected with the complementary sensing bit line SBLB. A (1_2)-th PMOS transistor P1_2 may include a first end connected with the sensing bit line SBL, a second end connected with the first sensing control signal LA, and a gate connected with the complementary sensing bit line SBLB. In some embodiments of the present disclosure, the voltage provided to the first sensing control signal LA may be referred to as the first input voltage Vinta.

A (1_3)-th NMOS transistor N1_3 may include a first end connected with the sensing bit line SBL, a second end connected with the complementary sensing bit line SBLB, and a gate connected with a first equalization signal EQ. In response to the first equalization signal EQ, the (1_3)-th NMOS transistor N1_3 may electrically connect the sensing bit line SBL and the complementary sensing bit line SBLB.

A (1_4)-th NMOS transistor N1_4 may include a first end connected with the equalization voltage node VPEQ, a second end connected with the complementary sensing bit line SBLB, and a gate connected with a second equalization signal PEQ. In response to the second equalization signal PEQ, the (1_4)-th NMOS transistor N1_4 may electrically connect the equalization voltage node VPEQ and the complementary sensing bit line SBLB. According to the above structure, voltages of different levels that are provided from the offset time adjustment circuit 160 to the equalization voltage node VPEQ may be provided to the complementary sensing bit line SBLB.

Figure 6:
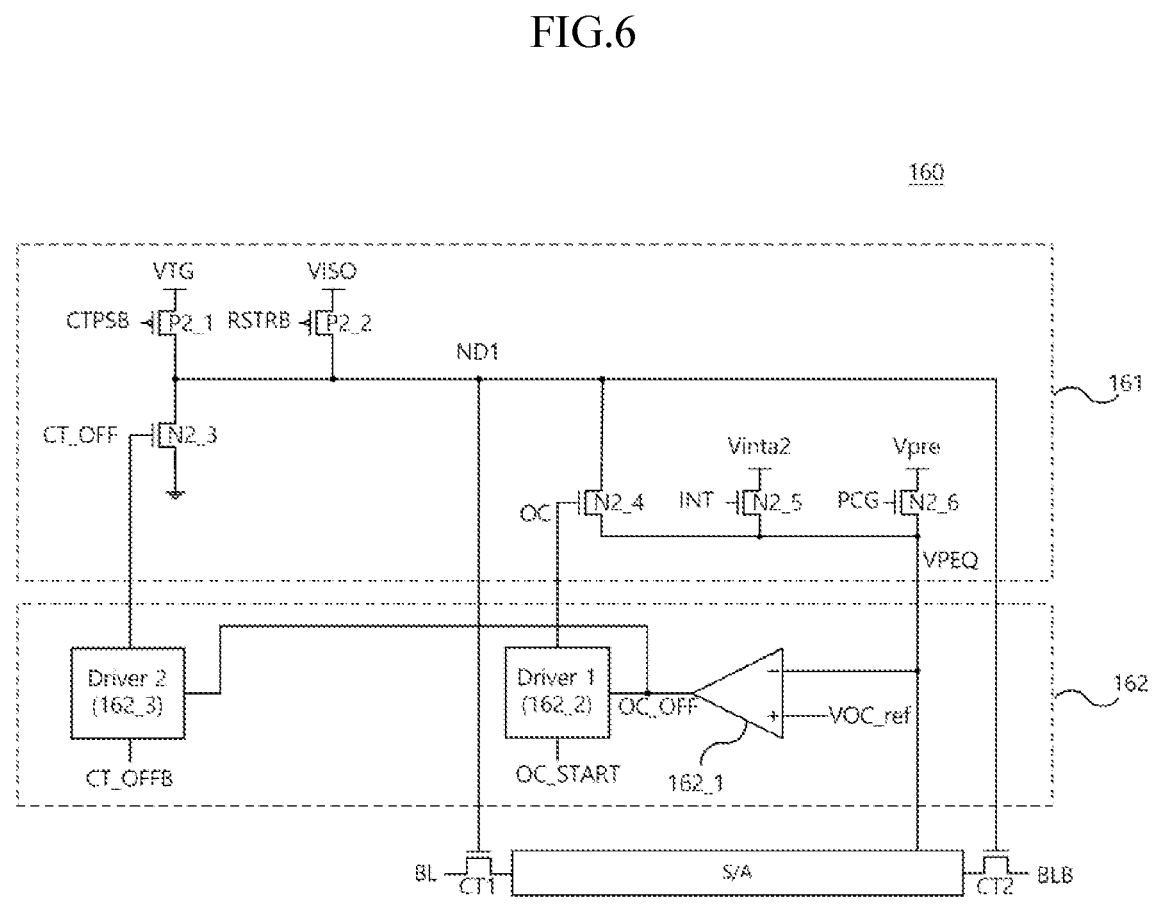

FIG. 6 is a circuit diagram illustrating an example of the offset time adjustment circuit 160 of FIG. 4.

Referring to FIG. 6, the conjunction unit 161 may include a plurality of NMOS transistors and a plurality of PMOS transistors.

A (2_1)-th PMOS transistor P2_1 may include a first end connected to receive the transfer gate voltage VTG, a second end connected with a first node ND1, and a gate connected to receive a charge transfer control signal (hereinafter referred to as a "CT control signal") CTPSB. In response to the CT control signal CTPSB, the (2_1)-th PMOS transistor P2_1 may provide the transfer gate voltage VTG to the first node ND1.

A (2_2)-th PMOS transistor P2_2 may include a first end connected to receive the isolation voltage VISO, a second end connected with the first node ND1, and a gate connected to receive a restore control signal (hereinafter referred to as an "RST control signal") RSTRB. In response to the RST control signal RSTRB, the (2_2)-th PMOS transistor P2_2 may provide the isolation voltage VISO to the first node ND1.

A (2_3)-th NMOS transistor N2_3 may include a first end connected with the first node ND1, a second end connected with the ground voltage Vss, and a gate connected with the first CT off signal CT_OFF. In response to the first CT off signal CT_OFF, the (2_3)-th NMOS transistor N2_3 may provide the ground voltage Vss to the first node ND1.

A (2_4)-th NMOS transistor N2_4 may include a first end connected with the first node ND1, a second end connected with the equalization voltage node VPEQ, and a gate connected with the offset compensation signal OC. In response to the offset compensation signal OC, the (2_4)-th NMOS transistor N2_4 may electrically connect the first node ND1 and the equalization voltage node VPEQ. As such, one of the voltages VTG, VISO, and Vss may be provided to the equalization voltage node VPEQ.

A (2_5)-th NMOS transistor N2_5 may include a first end connected with the second input voltage Vinta2, a second end connected with the equalization voltage node VPEQ, and a gate connected with a second input voltage application signal (hereinafter referred to as an "INT signal") INT. In response to the INT signal INT, the (2_5)-th NMOS transistor N2_5 may provide the second input voltage Vinta2 to the equalization voltage node VPEQ.

A (2_6)-th NMOS transistor N2_6 may include a first end connected to receive the precharge voltage Vpre, a second end connected with the equalization voltage node VPEQ, and a gate connected with a precharge signal PCG. In response to the precharge signal PCG, the (2_6)-th NMOS transistor N2_6 may provide the precharge voltage Vpre to the equalization voltage node VPEQ.

Continuing to refer to FIG. 6, the comparison unit 162 may include a comparator 162_1, a first driver 162_2, and a second driver 162_3.

The comparator 162_1 may receive the reference offset voltage VOC_ref from the variable voltage generator 190 (refer to FIG. 1). The comparator 162_1 may be connected with the equalization voltage node VPEQ. The comparator 162_1 may compare the reference offset voltage VOC_ref and the voltage level of the equalization voltage node VPEQ and may output an offset compensation off signal (hereinafter referred to as an "OC off signal") OC_OFF. For example, the comparator 162_1 may be configured to determine a comparison result of the reference offset voltage VOC_ref and the equalization voltage node VPEQ by comparing the reference offset voltage VOC_ref and the voltage at the equalization voltage node VPEQ. For example, when the voltage at the equalization voltage node VPEQ is identical or equal to the reference offset voltage VOC_ref, the comparator 162_1 may output the OC off signal OC_OFF.

The first driver 162_2 may receive an offset compensation start signal (hereinafter referred to as an "OC start signal")

OC_START. In response to the OC start signal OC_START, the first driver 162_2 may set the level of the offset compensation signal OC to logic high. In this case, the first node ND1 and the equalization voltage node VPEQ may be electrically connected, and thus, the voltage of the equalization voltage node VPEQ may be provided to the gates of the first and second charge transfer transistors CT1 and CT2.

The first driver 162_2 may receive the OC off signal OC_OFF from the comparator 162_1. In response to the OC off signal OC_OFF, the first driver 162_2 may set the level of the offset compensation signal OC to logic low. For example, in response to the OC off signal OC_OFF, the first driver 162_2 may be configured to control the offset compensation signal OC to set the level of the offset compensation signal OC to logic low such that the (2_4)-th NMOS transistor N2_4 is turned off. For example, the first driver 162_2 may be configured to determine a turn-off time of the (2_4)-th NMOS transistor N2_4 based on the OC off signal OC_OFF from the comparator 162_1 that is based on a comparison result of the reference offset voltage VOC_ref and the voltage at the equalization voltage node VPEQ. For example, the first driver 162_2 may be configured to determine a transition time of the offset compensation signal OC to transition from logic high to logic low based on the OC off signal OC_OFF from the comparator 162_1 that is based on a comparison result of the reference offset voltage VOC_ref and the voltage at the equalization voltage node VPEQ.

The second driver 162_3 may receive the OC off signal OC_OFF from the comparator 162_1. In response to the OC off signal OC_OFF, the second driver 162_3 may set the level of the first CT off signal CT_OFF to logic high. As such, the ground voltage Vss may be provided to the gates of the first and second charge transfer transistors CT1 and CT2. For example, the second driver 162_3 may be configured to determine a turn-on time of the (2_3)-th NMOS transistor N2_3 based on the OC off signal OC_OFF from the comparator 162_1 that is based on a comparison result of the reference offset voltage VOC_ref and the voltage at the equalization voltage node VPEQ.

Figure 7:
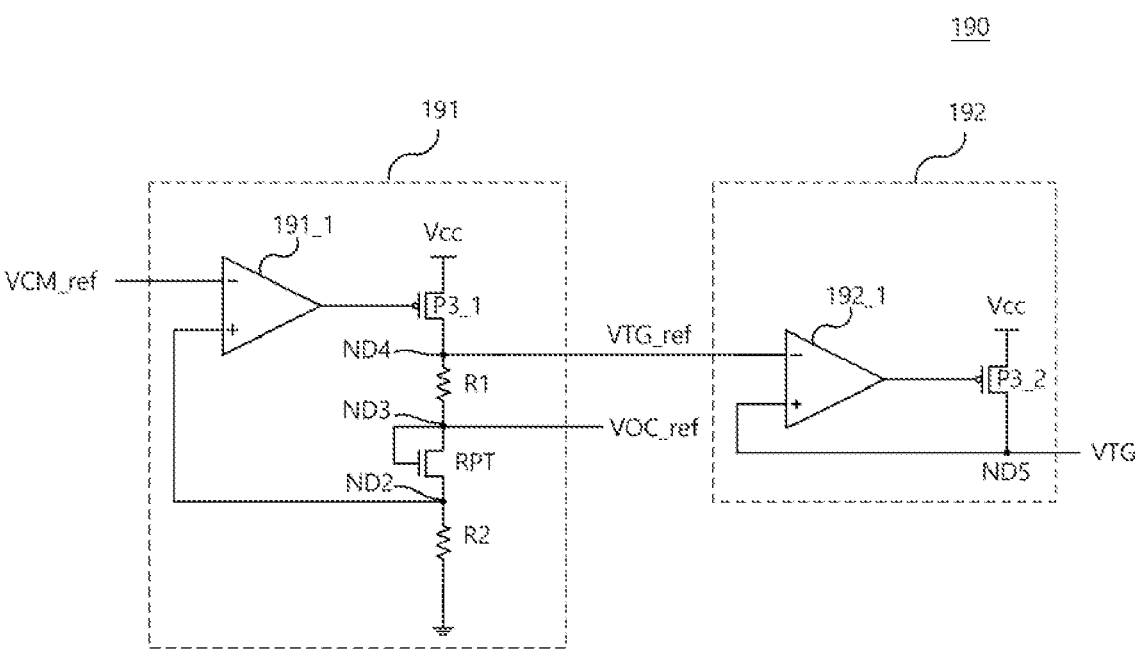
FIG. 7 is a circuit diagram illustrating an example of a variable voltage generator of FIG. 1.

FIG. 7 is a circuit diagram illustrating an example of the variable voltage generator 190 of FIG. 1.

Referring to FIG. 7, the variable voltage generator 190 may include a first low-dropout (LDO) regulator 191 and a second LDO regulator 192.

The first LDO regulator 191 may include an amplifier 191_1, a plurality of resistors, and at least one transistor.

An inverting input terminal of the amplifier 191_1 may receive a reference normal mode voltage VCM_ref from the outside (e.g., from an external source). Herein, the reference normal mode voltage VCM_ref may correspond to the voltage level of the bit line BL or the complementary bit line BLB when the offset compensating operation is completely performed (e.g., when the offset compensating operation has ended). For example, the voltage level of the reference normal mode voltage VCM_ref may be set to be smaller than the voltage level of the reference offset voltage VOC_ref. Also, a non-inverting input terminal of the amplifier 191_1 may be connected with a second node ND2, and an output terminal of the amplifier 191_1 may be connected with a gate of a (3_1)-th PMOS transistor P3_1.

The (3_1)-th PMOS transistor P3_1, a first resistor R1, a replica transistor RPT, and a second resistor R2 may be connected in series. The (3_1)-th PMOS transistor P3_1 may include a first end connected with a power supply voltage Vcc, a second end connected with a fourth node ND4, and a gate connected with an output terminal of the amplifier 191_1.

The first resistor R1, the replica transistor RPT, and the second resistor R2 may be connected in series to form a voltage divider. The first resistor R1 may include a first end connected with the fourth node ND4 and a second end connected with a third node ND3. The second resistor R2 may include a first end connected with the second node ND2 and a second end connected with the ground voltage Vss. A resistance ratio of the first resistor R1 and the second resistor R2 may be variously set or adjusted. For example, by adjusting the resistance ratio of the first resistor R1 and the second resistor R2, the level of a reference transfer gate voltage VTG_ref that is based on the reference offset voltage VOC_ref may be adjusted. For example, the resistance ratio of the first resistor R1 and the second resistor R2 may be adjusted through a mode register set (MRS) signal or a test mode register set (TMRS) signal.

The replica transistor RPT may be connected between the first resistor R1 and the second resistor R2, and a drain and a gate of the replica transistor RPT may be connected with each other. The replica transistor RPT may be a replica transistor associated with or corresponding to at least one of the elements of the sense amplifier 150. For example, the replica transistor RPT may be a replica transistor associated with the first charge transfer transistor CT1 (e.g., the replica transistor RPT may correspond to or replicate the first charge transfer transistor CT1). In this case, the replica transistor RPT may depend on the change in the threshold voltage of the first charge transfer transistor CT1 according to the PVT variations.

The voltage of the third node ND3 may be provided to the comparison unit 162 (refer to FIG. 6) as the reference offset voltage VOC_ref. For example, the voltage level of the reference offset voltage VOC_ref may be the voltage level that is obtained by adding the reference normal mode voltage VCM_ref and the threshold voltage of the replica transistor RPT or may correspond to the voltage level thus obtained. Accordingly, the change in the threshold voltage of the element according to the PVT variations may be applied to the reference offset voltage VOC_ref.

The voltage of the fourth node ND4 may be provided to the second LDO regulator 192 as the reference transfer gate voltage VTG_ref. For example, the voltage level of the reference transfer gate voltage VTG_ref may be the voltage level that is obtained by adding the reference offset voltage VOC_ref and a given magnitude. Accordingly, like the reference offset voltage VOC_ref, the change in the threshold voltage of the element according to the PVT variations may also be applied to the reference transfer gate voltage VTG_ref.

The second LDO regulator 192 may include an amplifier 192_1 and at least one transistor.

An inverting input terminal of the amplifier 192_1 may receive the reference transfer gate voltage VTG_ref from the first LDO regulator 191. Also, a non-inverting input terminal of the amplifier 192_1 may be connected with a fifth node ND5, and an output terminal of the amplifier 192_1 may be connected with a gate of a (3_2)-th PMOS transistor P3_2. The (3_2)-th PMOS transistor P3_2 may include a first end connected with the power supply voltage Vcc, a second end connected with the fifth node ND5, and a gate connected with the output terminal of the amplifier 192_1. The voltage of the fifth node ND5 may be provided to the conjunction unit 161 (refer to FIG. 4) as the transfer gate voltage VTG.

For example, the transfer gate voltage VTG may be based on the reference transfer gate voltage VTG_ref.

As described above, the variable voltage generator 190 may generate the reference offset voltage VOC_ref, to which the change in the threshold voltage of the element according to the PVT variations is applied, through the first LDO regulator 191 and may provide the reference offset voltage VOC_ref to the comparison unit 162. As such, when the offset compensating operation is performed, there may be adjusted a time necessary to perform the offset compensating operation based on the offset level according to the PVT variations.

Also, the variable voltage generator 190 may generate the transfer gate voltage VTG, to which the change in the threshold voltage of the element according to the PVT variations is applied, through the first and second LDO regulators 191 and 192 and may provide the transfer gate voltage VTG to the conjunction unit 161. Accordingly, during the charge transfer operation, the accurate transfer gate voltage VTG may be provided to the first and second charge transfer transistors CT1 and CT2, and thus, the reliability of the memory device 100A may be improved.

Figure 8:
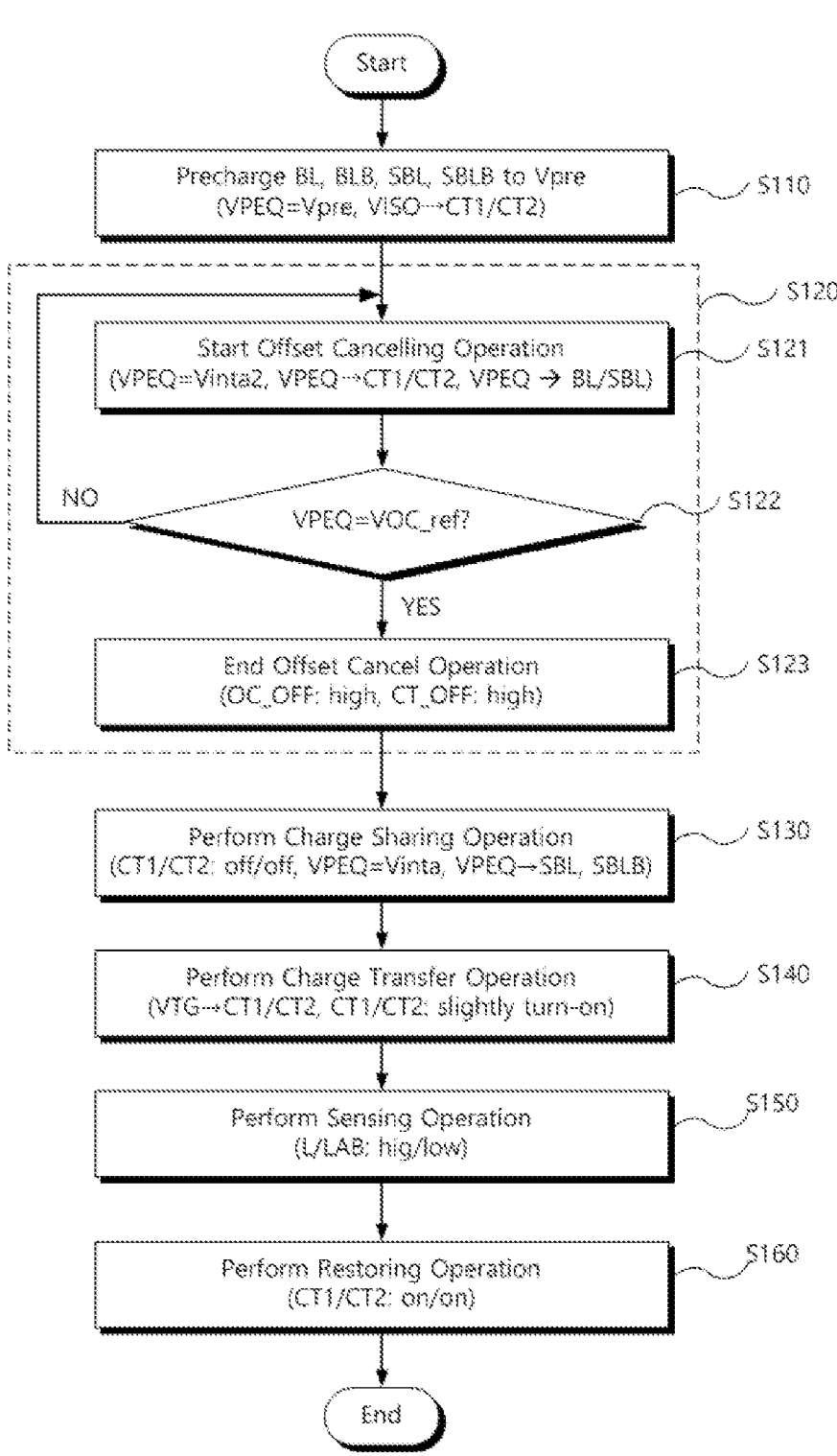
FIG. 8 is a flowchart illustrating an example of a refresh operation of a memory device of FIG. 1.
Figure 9A:
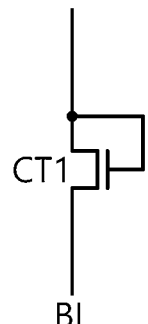
FIGS. 9A, 9B, 10A, and 10B are diagrams for describing an offset compensating operation during a refresh operation.
Figure 9B:
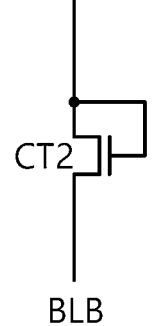
Figure 10A:
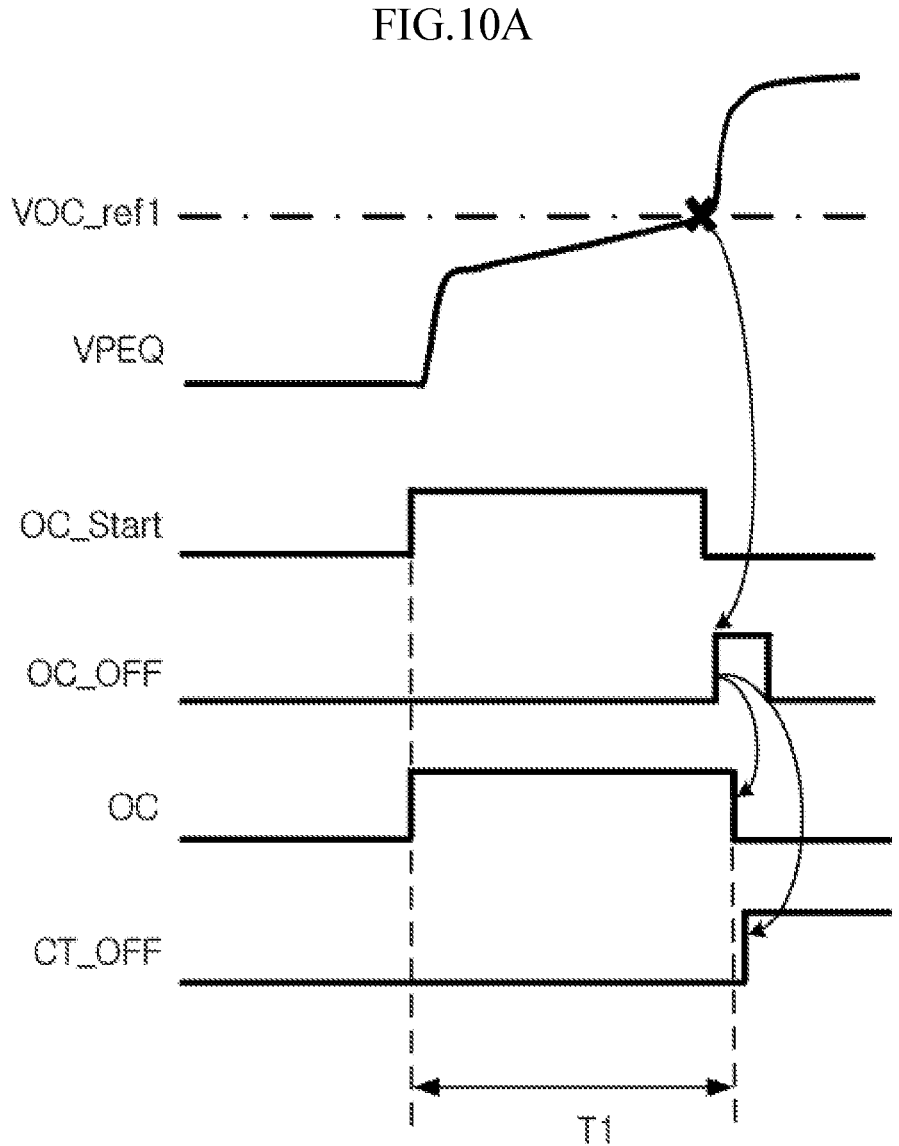
Figure 10B:
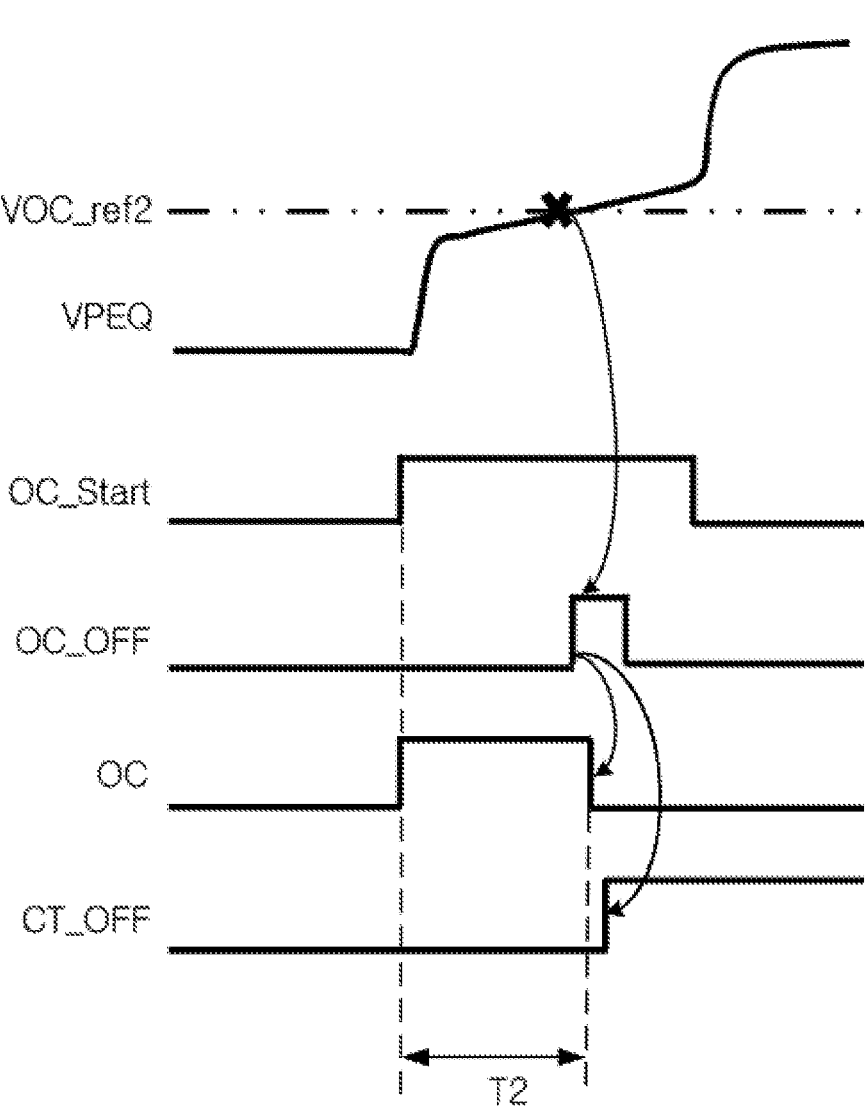
Figure 11A:
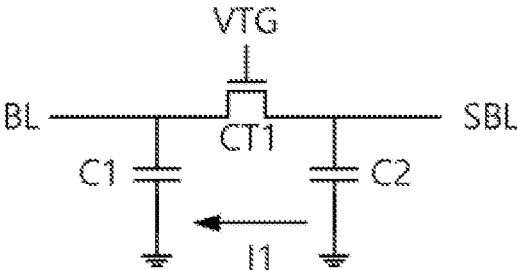
Figure 11B:
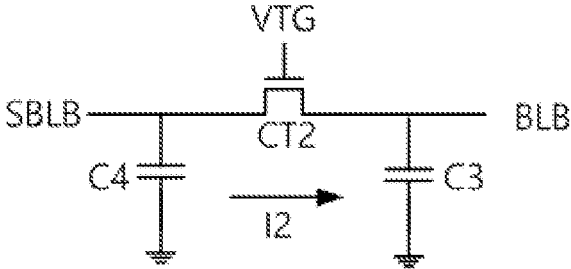

FIG. 8 is a flowchart illustrating an example of a refresh operation of the memory device 100A of FIG. 1. FIGS. 9A, 9B, 10A, and 10B are diagrams for describing an offset compensating operation during a refresh operation, and FIGS. 11A, 11B, and 12 are diagrams for describing a charge transfer operation during a refresh operation.

For convenience of description, below, an example of the refresh operation of the present disclosure will be described in detail with reference to FIGS. 1 to 12.

1. Precharging Operation

Referring to FIG. 8, in operation S110, the bit line BL, the complementary bit line BLB, the sensing bit line SBL, and the complementary sensing bit line SBLB may be precharged with the precharge voltage Vpre.

For example, referring to FIG. 6, the RST control signal RSTRB may be at logic low, and thus, the (2_2) PMOS transistor P2_2 may be turned on. In this case, the isolation voltage VISO may be provided to the gates of the first and second charge transfer transistors CT1 and CT2, and the first and second charge transfer transistors CT1 and CT2 may be turned on. According to the above condition, the bit line BL and the sensing bit line SBL may be electrically connected, and the complementary bit line BLB and the complementary sensing bit line SBLB may be electrically connected. Also, referring to FIG. 5, the first equalization signal EQ may be at logic high. In this case, the bit line BL, the complementary bit line BLB, the sensing bit line SBL, and the complementary sensing bit line SBLB may be electrically connected. As used herein, a transistor may be "turned on" (or similar language) when a current can flow therethrough. As used herein, a transistor may be "turned off" (or similar language) when little to no current can flow therethrough (e.g., a leakage current may still exist).

Referring to FIGS. 5 and 6, the precharge signal PCG may be at logic high, and thus, the precharge voltage Vpre may be provided to the equalization voltage node VPEQ. When the second equalization signal PEQ is at logic high, the voltage of the equalization voltage node VPEQ may be transferred to the bit line BL, the complementary bit line BLB, the sensing bit line SBL, and the complementary sensing bit line SBLB that are electrically connected. As a result, the bit line BL, the complementary bit line BLB, the sensing bit line SBL, and the complementary sensing bit line SBLB may be precharged with the precharge voltage Vpre.

2. Offset Compensating Operation

Referring to FIG. 8, in operation S120, the offset compensating operation may be performed.

In detail, in operation S121, the offset compensating operation may start.

For example, referring to FIG. 6, the INT signal INT may be at logic high. In this case, the (2_5)-th NMOS transistor N2_5 may be turned on such that the second input voltage Vinta2 is provided to the equalization voltage node VPEQ.

Also, the offset compensation signal OC may be at logic high. In this case, as the (2_4)-th NMOS transistor N2_4 is turned on, the second input voltage Vinta2 being the voltage level of the equalization voltage node VPEQ may be provided to the first and second charge transfer transistors CT1 and CT2.

Referring to FIG. 5, both the first equalization signal EQ and the second equalization signal PEQ may be at logic high. When the first equalization signal EQ and the second equalization signal PEQ are at logic high, the sensing bit line SBL and the complementary sensing bit line SBLB may be electrically connected, and the second input voltage Vinta2, that is the voltage at the equalization voltage node VPEQ, may be provided to the sensing bit line SBL and the complementary sensing bit line SBLB that are electrically connected.

As a result, the second input voltage Vinta2 may be provided to the gate and the drain of the first charge transfer transistor CT1. In this case, as illustrated in FIGS. 9A, the diode connection may be formed such that the threshold voltage of the first charge transfer transistor CT1 may be reflected in the bit line BL Likewise, the second input voltage Vinta2 may be provided to the gate and the drain of the second charge transfer transistor CT2. In this case, as illustrated in FIGS. 9B, the diode connection may be formed such that the threshold voltage of the second charge transfer transistor CT2 may be reflected in the complementary bit line BLB. The difference of the threshold voltages between the first charge transfer transistor CT1 and the second charge transfer transistor CT2 may be referred to as a threshold voltage offset. The threshold voltage offset can be reduced or canceled by providing the second input voltage Vinta2 while the offset compensating operation is performed.

In operation S122, whether the voltage level of the equalization voltage node VPEQ is identical or equal to the reference offset voltage VOC_ref is determined.

For example, referring to FIG. 6, in the comparison unit 162, the reference offset voltage VOC_ref may be provided to the non-inverting input terminal of the comparator 162_1, and the inverting input terminal of the comparator 162_1 may be connected with the equalization voltage node VPEQ. As the offset compensating operation proceeds, the voltage of the equalization voltage node VPEQ may gradually increase. When the voltage level of the equalization voltage node VPEQ is identical or equal to the reference offset voltage VOC_ref, the comparator 162_1 may output the OC off signal OC_OFF.

In operation S123, the offset compensating operation may end.

For example, referring to FIG. 6, the first driver 162_2 may allow the offset compensation signal OC to transition from logic high to logic low in response to the OC off signal OC_OFF. As such, the second input voltage Vinta2 may not be provided to the gates of the first and second charge transfer transistors CT1 and CT2 any longer. Also, the second driver 162_3 may allow the first CT off signal CT_OFF to transition from logic low to logic high in response to the OC off signal OC_OFF. As such, the ground voltage Vss may be provided to the gates of the first and second charge transfer transistors CT1 and CT2. That is, the first and second charge transfer transistors CT1 and CT2 may be turned off. In other words, the offset compensating operation may end.

As described above, the voltage level of the reference offset voltage VOC_ref may depend on the threshold voltage of the element according to the PVT variations. This may mean that the time when the voltage level of the reference offset voltage VOC_ref is identical to the voltage level of the equalization voltage node VPEQ varies depending on the PVT variations. In other words, a time necessary to perform the offset compensating operation may change depending on the PVT variations.

The following description will be given in detail with reference to FIGS. 10A and 10B. It is assumed that a first reference offset voltage VOC_ref1 is a reference offset voltage generated in a first environment and a second reference offset voltage VOC_ref2 is a reference offset voltage generated in a second environment different from the first environment. As such, the variation in the threshold voltage applied to the first reference offset voltage VOC_ref1 may be different from the variation in the threshold voltage applied to the second reference offset voltage VOC_ref2. For convenience of description, it is assumed that the voltage level of the first reference offset voltage VOC_ref1 is higher than the voltage level of the second reference offset voltage VOC_ref2.

In this case, the time when the voltage level of the first reference offset voltage VOC_ref1 is identical or equal to the voltage level of the equalization voltage node VPEQ may be delayed with respect to the time when the voltage level of the second reference offset voltage VOC_ref2 is identical or equal to the voltage level of the equalization voltage node VPEQ. That is, the execution time T1 of the offset compensating operation performed in the first environment may be longer than the execution time T2 of the offset compensating operation performed in the second environment. Accordingly, as the execution time of the offset compensating operation according to some embodiments of the present disclosure varies depending on the PVT variations, accurate offset compensation may be possible.

3. Charge Sharing Operation

Referring to FIG. 8, in operation S130l, the charge sharing operation may be performed.

For example, referring to FIGS. 5 and 6, when the first CT off signal CT_OFF is at logic high, the ground voltage Vss may be provided to the gates of the first and second charge transfer transistors CT1 and CT2. In this case, the first and second charge transfer transistors CT1 and CT2 may be turned off such that the bit line BL and the sensing bit line SBL are separated from each other and the complementary bit line BLB and the complementary sensing bit line SBLB are separated from each other. Under this condition, when the word line WL (refer to FIG. 2) connected with the memory cell MC is activated, the charge sharing may be made between the capacitor of the memory cell MC and the bit line BL.

The INT signal INT, the first equalization signal EQ, and the second equalization signal PEQ may be at logic high. Accordingly, the second input voltage Vinta2 may be transferred to the sensing bit line SBL and the complementary sensing bit line SBLB through the equalization voltage node VPEQ, and the voltage levels of the sensing bit line SBL and the complementary sensing bit line SBLB may increase.

4. Charge Transfer Operation

Referring to FIG. 8, in operation S140, the charge transfer operation may be performed.

For example, referring to FIG. 6, the CT control signal CTPSB may transition to logic low. As such, the transfer gate voltage VTG may be provided to the gates of the first and second charge transfer transistors CT1 and CT2 through the first node ND1.

In this case, the transfer gate voltage VTG may have the voltage level enough to slightly turn on the first and second charge transfer transistors CT1 and CT2. As the first and second charge transfer transistors CT1 and CT2 are slightly turned on, as illustrated in FIGS. 11A and 11B, the bit line BL and the sensing bit line SBL may be slightly connected with each other. Also, the complementary bit line BLB and the complementary sensing bit line SBLB may be slightly connected with each other. Because the first equalization signal EQ and the second equalization signal PEQ are at logic low, the sensing bit line SBL and the complementary sensing bit line SBLB may be electrically separated.

In the charge sharing operation, because the voltage level of the sensing bit line SBL increases to a given voltage level, as illustrated in FIG. 11A, a current may flow from the sensing bit line SBL to the bit line BL. That is, charges may move from the bit line BL to the sensing bit line SBL.

In this case, because the capacity of the first capacitor C1 corresponding to the bit line BL is greater than the capacity of the second capacitor C2 corresponding to the sensing bit line SBL, a decrement of the voltage level of the sensing bit line SBL may be greater than an increment of the voltage level of the bit line BL. For example, it is assumed that the capacity of the first capacitor C1 is 10 times the capacity of the second capacitor C2. According to this assumption, when the voltage level of the bit line BL increases as much as 10 mV, the voltage level of the sensing bit line SBL may decrease as much as 100 mV.

Likewise, because the capacity of the third capacitor C3 corresponding to the complementary bit line BLB is greater than the capacity of the fourth capacitor C4 corresponding to the complementary sensing bit line SBLB, a decrement of the voltage level of the complementary sensing bit line SBLB may be greater than an increment of the voltage level of the complementary bit line BLB.

In some embodiments of the present disclosure, to accurately control the operation in which the first and second charge transfer transistors CT1 and CT2 are slightly turned on, the voltage level of the transfer gate voltage VTG may be generated such that the offset change according to the PVT variations is applied thereto.

For example, Referring to FIGS. 7 and 12, it is assumed that the voltage level of the reference normal mode voltage VCM_ref is 0.4 V, the charge transfer transistor CT has a first threshold voltage Vth1 in the first PVT condition, and the charge transfer transistor CT has a second threshold voltage Vth2 in the second PVT condition. Also, it is assumed that the second threshold voltage Vth2 is greater than the first threshold voltage Vth1. In this case, as the reference offset voltage VOC_ref, the variable voltage generator 190 may generate the voltage of "0.4V+Vth1" in the first PVT condition and may generate the voltage of "0.4V+ Vth2" in the second PVT condition. Also, as the transfer gate voltage VTG, the variable voltage generator 190 may generate the voltage of "0.5V+Vth1" in the first PVT condition and may generate the voltage of "0.5V+Vth2" in the second PVT condition.

As described above, the voltage level of the transfer gate voltage VTG according to some embodiments of the present disclosure may vary depending on the offset level according to the PVT variations. As the voltage level of the transfer gate voltage VTG is adjusted depending on the offset level, the offset may be accurately compensated for.

5. Sensing Operation

Referring to FIG. 8, in operation S150, the sensing operation may be performed.

For example, referring to FIG. 5, like the charge transfer operation, the logic levels of the first sensing control signal LA and the second sensing control signal LAB may transition in a state where the first and second charge transfer transistors CT1 and CT2 are slightly turned on. For example, as a first input voltage Vinta is provided to the first sensing control signal LA, the logic level of the first sensing control signal LA may transition. As such, a voltage difference of the sensing bit line SBL and the complementary sensing bit line SBLB may become greater.

6. Restoring Operation

Referring to FIG. 8, in operation S160, the restoring operation may be performed.

For example, referring to FIG. 6, the RST control signal RSTRB may transition to logic low, and the isolation voltage VISO may be provided to the gates of the first and second charge transfer transistors CT1 and CT2. As such, the bit line BL and the sensing bit line SBL may be connected with each other, and the complementary bit line BLB and the complementary sensing bit line SBLB may be connected with each other. In this case, the voltage level of the bit line BL may increase or decrease to the voltage level of the sensing bit line SBL, and the voltage level of the complementary bit line BLB may increase or decrease to the voltage level of the complementary sensing bit line SBLB.

As described above, the memory device 100A according to some embodiments of the present disclosure may sequentially perform the precharge operation, the offset compensating operation, the charge sharing operation, the charge transfer operation, the sensing operation, and the restoring operation during the refresh operation.

In particular, when the offset compensating operation is performed, a time necessary to perform the offset compensating operation may be adjusted depending on the offset level according to the PVT variations. Also, when the charge transfer operation is performed, the offset change according to the PVT variations may be applied to the transfer gate voltage VTG that is provided to the gates of the first and second charge transfer transistors CT1 and CT2. Accordingly, the offset may be accurately compensated for, and the effective sensing margin may increase.

Figure 13:
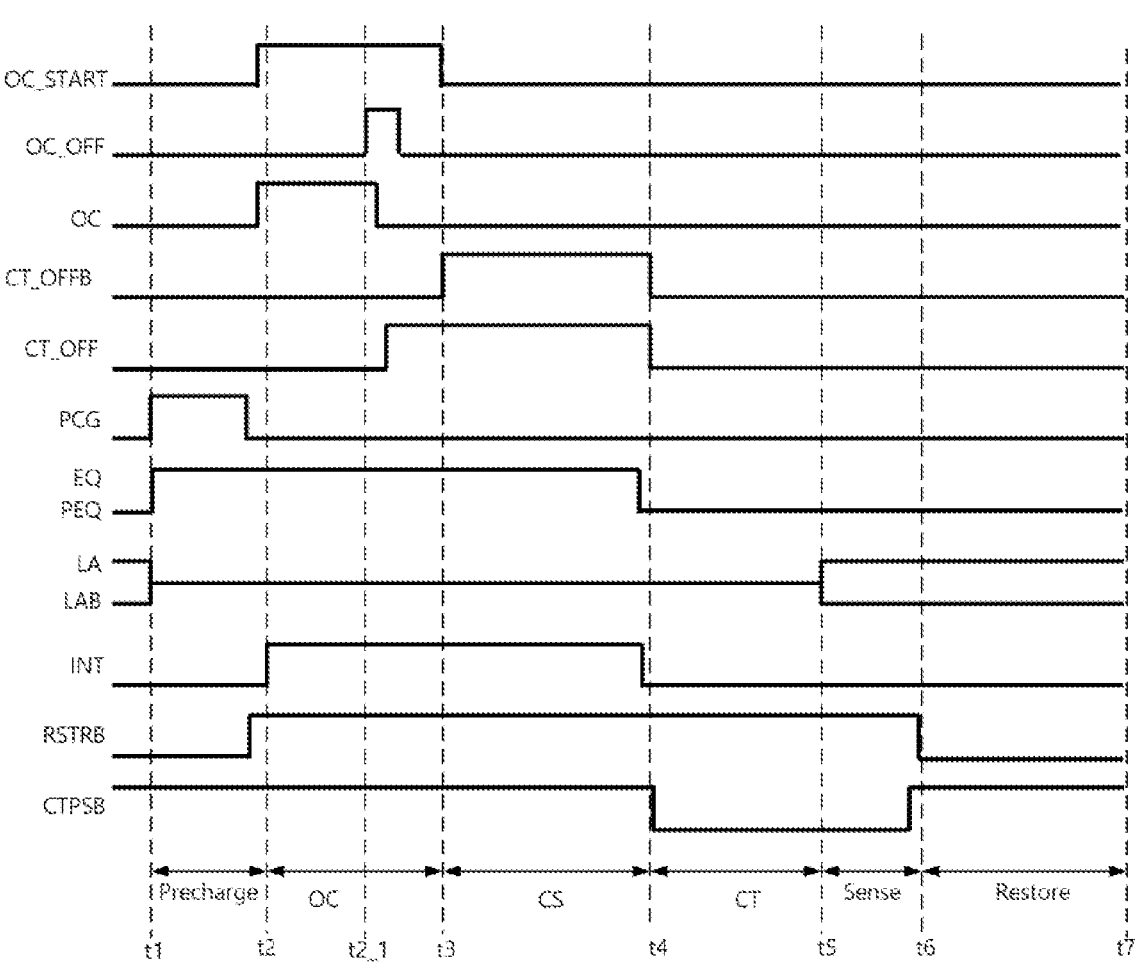
FIG. 13 is a timing diagram illustrating an example of a refresh operation of a memory device of FIG. 1.
Figure 14:
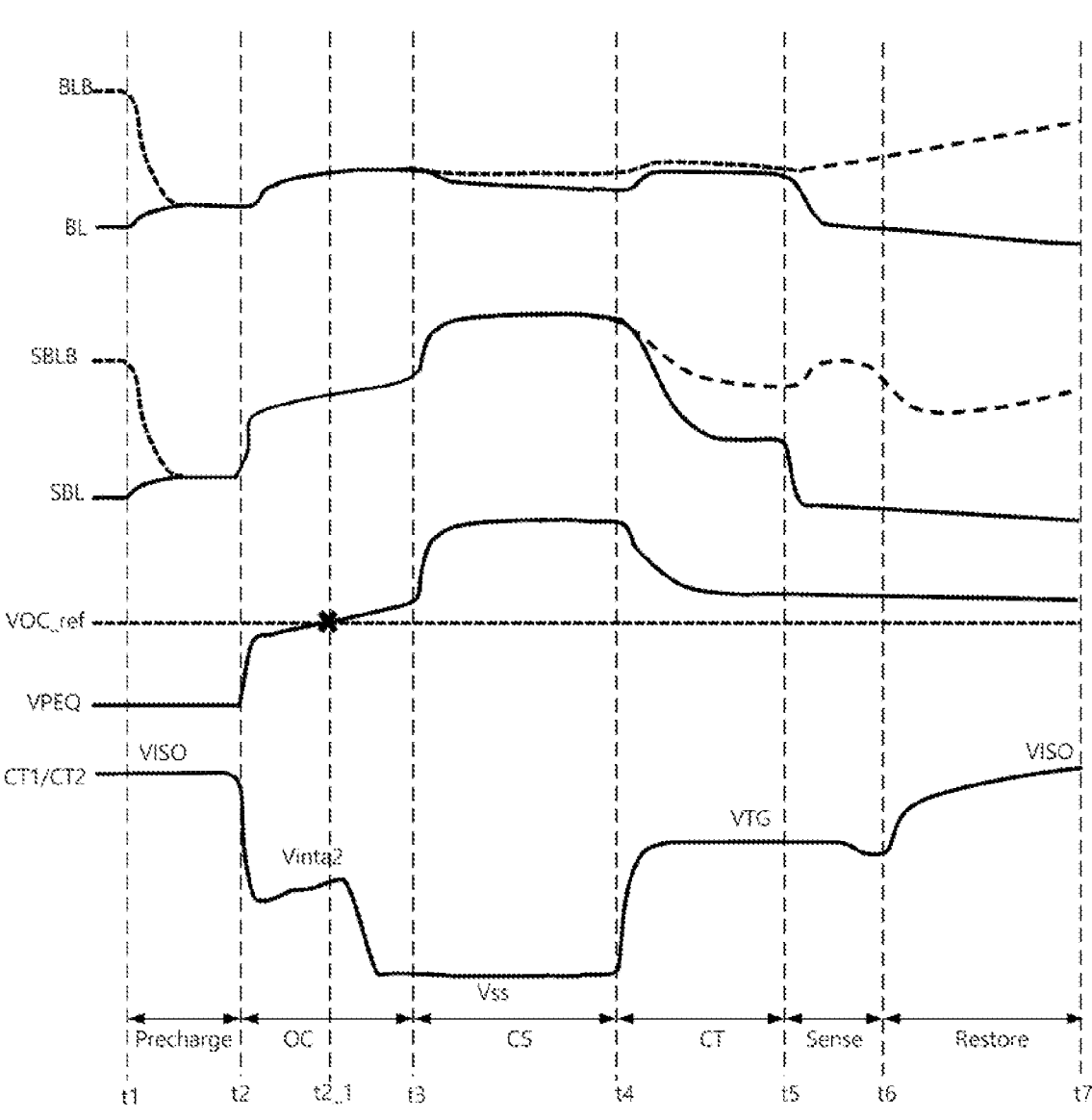
FIG. 14 is a timing diagram illustrating a change of a voltage level according to a refresh operation of FIG. 13.

FIG. 13 is a timing diagram illustrating an example of a refresh operation of the memory device 100A of FIG. 1, and FIG. 14 is a timing diagram illustrating a change of a voltage level according to a refresh operation of FIG. 13.

Referring to FIGS. 13 and 14, the memory device 100A may sequentially perform the precharge operation, the offset compensating operation, the charge sharing operation, the charge transfer operation, the sensing operation, and the restoring operation.

First, in a first time period from t1 to t2, the precharge operation may be performed.

For example, at the first time t1, the precharge signal PCG may transition from logic low to logic high, and the first and second equalization signals EQ and PEQ may transition from logic low to logic high. Accordingly, the bit line BL, the complementary bit line BLB, the sensing bit line SBL, and the complementary sensing bit line SBLB may be precharged with the precharge voltage Vpre.

In a second time period from t2 to t3, the offset compensating operation may be performed.

For example, at the second time t2, the offset compensation signal OC and the OC start signal OC_START may transition from logic low to logic high, and the INT signal INT may transition from logic low to logic high. As such, the second input voltage Vinta2 may be provided to the gate and the drain of the first charge transfer transistor CT1, and the second input voltage Vinta2 may be provided to the gate and the drain of the second charge transfer transistor CT2.

For example, at a time t2_1, the voltage level of the equalization voltage node VPEQ may be identical to the reference offset voltage VOC_ref. In this case, the OC off signal OC_OFF and the first CT off signal CT_OFF may transition from logic low to logic high, and the offset compensation signal OC may transition from logic high to logic low. That is, the first and second charge transfer transistors CT1 and CT2 may be turned off. In other words, the offset compensating operation may end.

In a third time period from t3 to t4, the charge sharing operation may be performed.

For example, at the third time t3, the OC start signal OC_START may transition from logic high to logic low, and a second CT off signal CT_OFFB may transition from logic low to logic high, and the first CT off signal CT_OFF may be at logic high. In this case, the bit line BL and the sensing bit line SBL may be separated from each other, and the complementary bit line BLB and the complementary sensing bit line SBLB may be separated from each other. Under this condition, when the word line WL connected with the memory cell MC is activated, the charge sharing may be performed between the capacitor of the memory cell MC and the bit line BL.

In a fourth time period from t4 to t5, the charge transfer operation may be performed.

For example, at the fourth time t4, the CT control signal CTPSB may transition to logic low. As such, the transfer gate voltage VTG may be provided to the gates of the first and second charge transfer transistors CT1 and CT2, and the first and second charge transfer transistors CT1 and CT2 may be slightly turned on.

In a fifth time period from t5 to t6, the sensing operation may be performed.

For example, at the fifth time t5, as the logic levels of the first sensing control signal LA and the second sensing control signal LAB transition, a voltage difference of the sensing bit line SBL and the complementary sensing bit line SBLB may become greater. For example, as the first input voltage Vinta is provided to the first sensing control signal LA, the logic level of the first sensing control signal LA may transition. For example, the level of the first input voltage Vinta may be lower than the level of the second input voltage Vinta2.

In a sixth time period from t6 to t7, the restoring operation may be performed.

For example, at the sixth time t6, the RST control signal RSTRB may transition to logic low. As such, the bit line BL and the sensing bit line SBL may be connected with each other, and the voltage level of the bit line BL may increase or decrease to the voltage level of the sensing bit line SBL. Also, the complementary bit line BLB and the complementary sensing bit line SBLB may be connected with each other, and the voltage level of the complementary bit line BLB may increase or decrease to the voltage level of the complementary sensing bit line SBLB.

The above description is provided as an example, and the present disclosure may be variously changed and applied.

Below, various modified embodiments of the present disclosure will be described in detail. For brief description, the description that is given above will be omitted to avoid redundancy, and components that are identical or similar to the above components may be marked by the same or like reference numerals.

Figure 15:
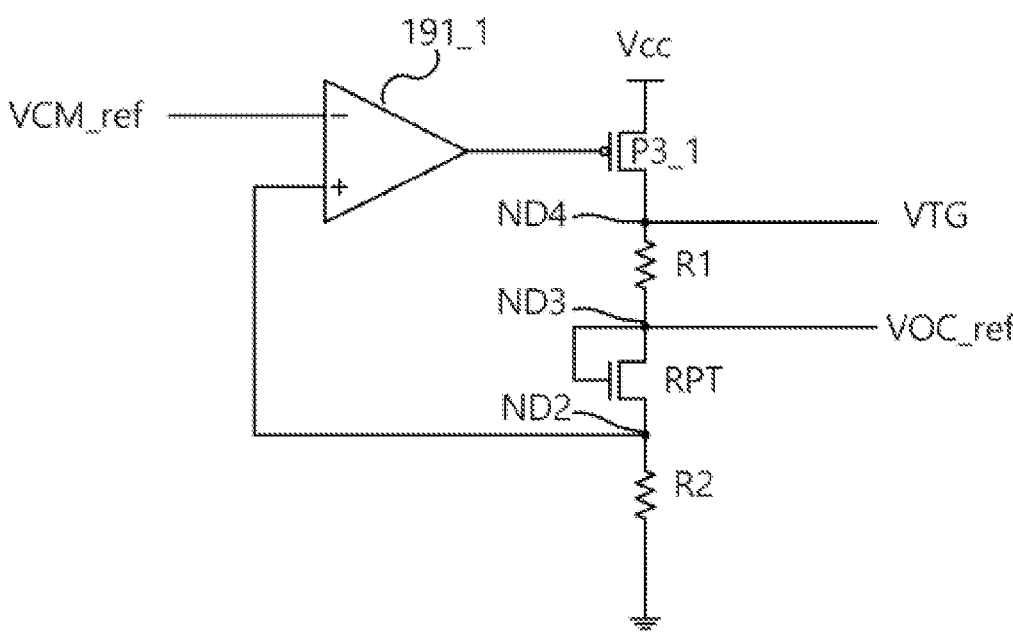
FIG. 15 is a circuit diagram illustrating another example of a variable voltage generator of FIG. 1.

FIG. 15 is a circuit diagram illustrating another example of a variable voltage generator 190_1 of FIG. 1.

Compared to the variable voltage generator 190 of FIG. 7 including two LDO regulators 191 and 192, the variable voltage generator 190_1 of FIG. 15 may be implemented only with one LDO regulator. The variable voltage generator 190_1 may include an amplifier 191_1, a plurality of resistors R1 and R2, one PMOS transistor P3_1, and one replica transistor RPT. In this case, the voltage of the third node ND3 may be provided as the reference offset voltage VOC_ref, and the voltage of the fourth node ND4 may be provided as the transfer gate voltage VTG. As such, the variable voltage generator 190_1 may be implemented to be smaller in size.

Figure 16:
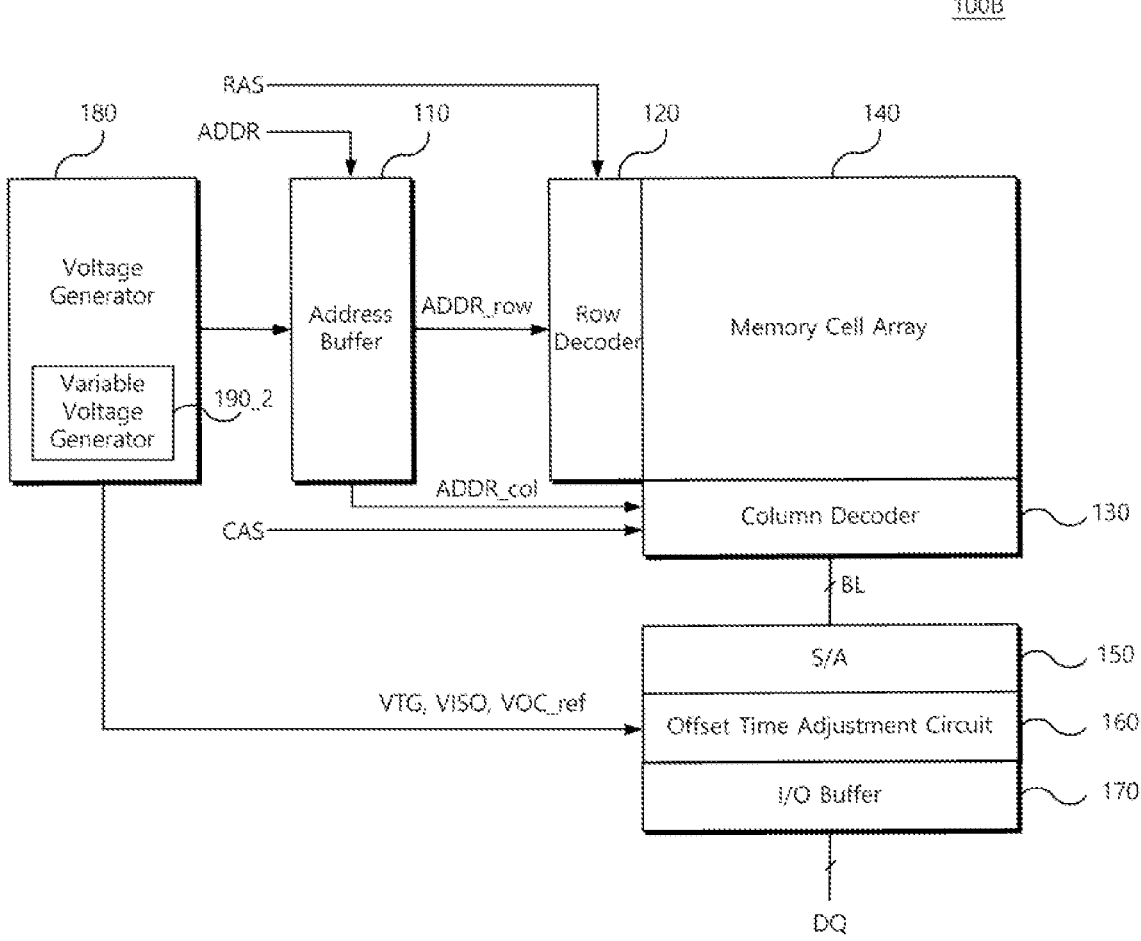
FIG. 16 is a block diagram illustrating another example of a memory device according to some embodiments of the present disclosure.
Figure 17:
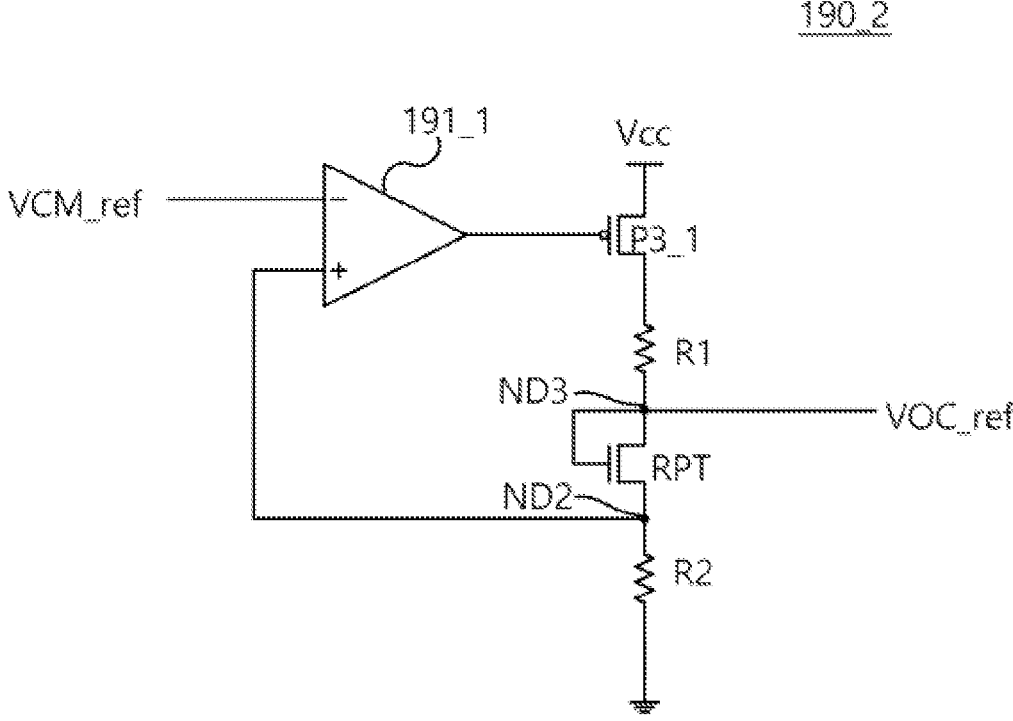
FIG. 17 is a diagram illustrating an example of a variable voltage generator of a memory device of FIG. 16.

FIG. 16 is a block diagram illustrating another example of a memory device 100B according to some embodiments of the present disclosure. FIG. 17 is a diagram illustrating an example of a variable voltage generator 190_2 of the memory device 100B of FIG. 16.

Referring to FIG. 16, the memory device 100B may include the address buffer 110, the row decoder 120, the column decoder 130, the memory cell array 140, the sense amplifier 150, the offset time adjustment circuit 160, the input/output buffer 170, and the voltage generator 180.

Compared to the memory device 100A of FIG. 1 that adjusts the execution time of the offset compensating operation and the voltage level of the transfer gate voltage VTG based on the PVT variations, the memory device 100B of FIG. 16 may adjust only the execution time of the offset compensating operation. In this case, the variable voltage generator 190_2 may be implemented to generate only the reference offset voltage VOC_ref.

For example, referring to FIG. 17, the variable voltage generator 190_2 may output the reference offset voltage VOC_ref through the third node ND3. In this case, because the transfer gate voltage VTG is a fixed voltage level to which the PVT variations are not applied, the transfer gate voltage VTG may be separately generated by the voltage generator 180.

As such, the memory device 100B according to some embodiments of the present disclosure may accurately compensate for the offset by adjusting the execution time of the offset compensating operation.

Figure 18:
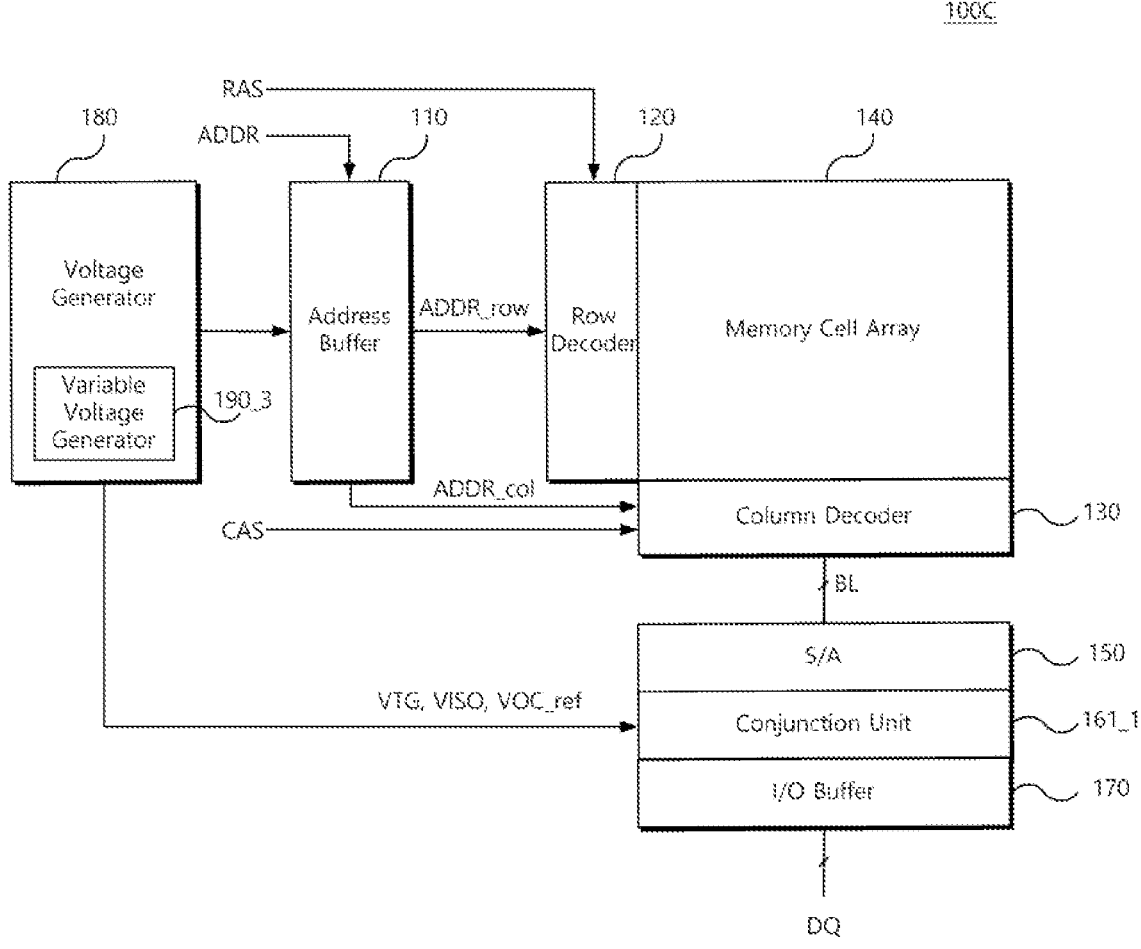
FIG. 18 is a block diagram illustrating another example of a memory device according to some embodiments of the present disclosure.
Figure 19:
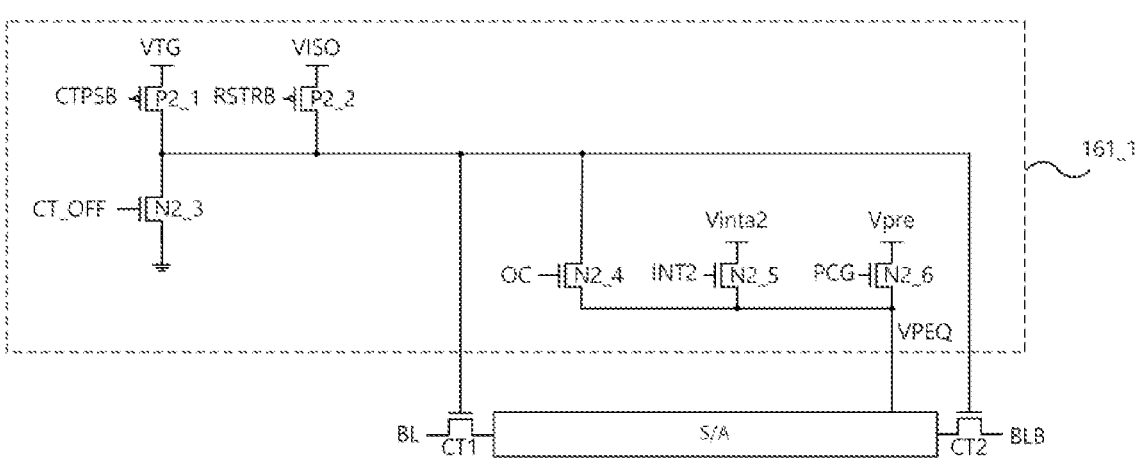
FIG. 19 is a diagram illustrating an example of a conjunction unit of a memory device of FIG. 18.
Figure 20:
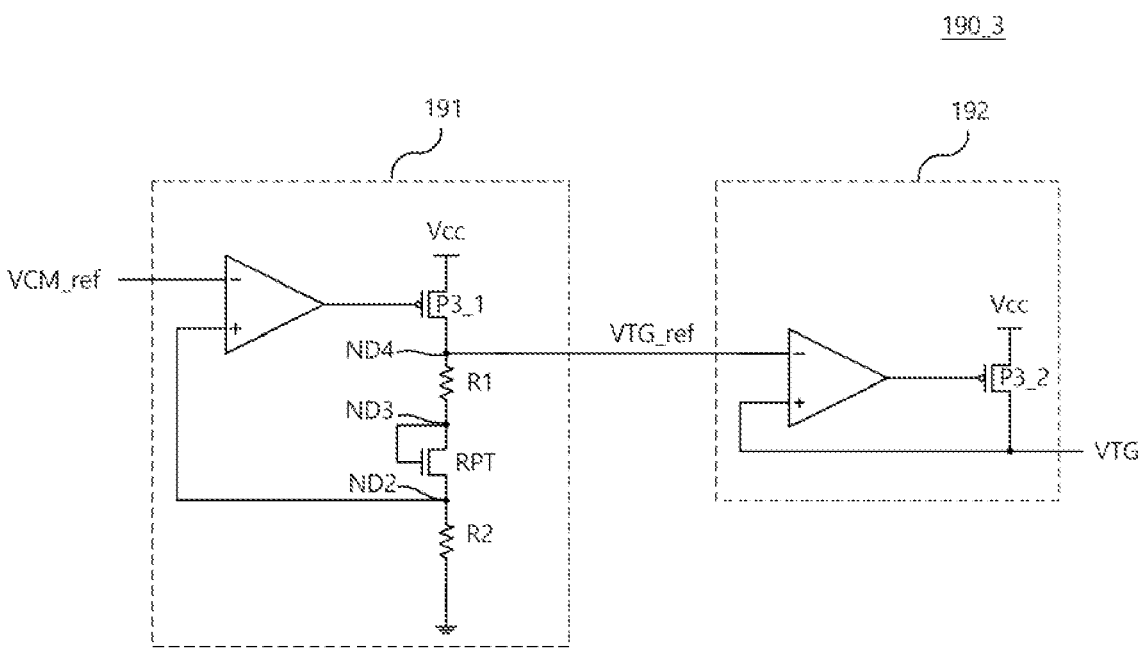
FIG. 20 is a diagram illustrating an example of a variable voltage generator of a memory device of FIG. 18.

FIG. 18 is a block diagram illustrating another example of a memory device 100C according to some embodiments of the present disclosure. FIG. 19 is a diagram illustrating an example of a conjunction unit 161_1 of the memory device 100C of FIG. 18. FIG. 20 is a diagram illustrating an example of a variable voltage generator 190_3 of the memory device 100C of FIG. 18.

Referring to FIG. 18, the memory device 100C may include the address buffer 110, the row decoder 120, the column decoder 130, the memory cell array 140, the sense amplifier 150, a conjunction unit 161_1, the input/output buffer 170, and the voltage generator 180.

Compared to the memory device 100A of FIG. 1 that adjusts the execution time of the offset compensating operation and the voltage level of the transfer gate voltage VTG based on the PVT variations, the memory device 100C of FIG. 18 may adjust only the voltage level of the transfer gate voltage VTG. In this case, the memory device 100C may include only the conjunction unit 161_1 without the comparison unit 162.

For example, referring to FIG. 19, the conjunction unit 161_1 may include a plurality of NMOS transistors and a plurality of PMOS transistors. Unlike the conjunction unit 161 of FIG. 6, the offset compensation signal OC that is provided to the conjunction unit 161_1 of FIG. 19 may maintain logic high during a given time period. Also, the first CT off signal CT_OFF that is provided to the conjunction unit 161_1 of FIG. 19 may transition from logic low to logic high at a given time. The conjunction unit 161_1 may also be referred to as a conjunction circuit 161_1 and may be implemented by software, hardware, or a combination thereof.

Referring to FIG. 20, the variable voltage generator 190_3 may be implemented to include the first LDO regulator 191 and the second LDO regulator 192. However, compared to the variable voltage generator 190 of FIG. 7 that outputs the voltage of the third node ND3 as the reference offset voltage VOC_ref, the variable voltage generator 190_3 of FIG. 20 may not output the voltage of the third node ND3 as the reference offset voltage VOC_ref.

According to the above description, the memory device 100C according to some embodiments of the present disclosure may accurately compensate for the offset by adjusting the transfer gate voltage VTG provided to the gate of the transfer transistor.

Memory devices according to the present disclosure may adjust a time necessary to perform the offset compensating operation or a level of a transfer gate voltage provided in a charge transfer operation, based on the PVT variations. Accurately, the offset according to the PVT variations may be accurately compensated for, and the effective sensing margin may increase.

As used herein, the terms "comprises", "comprising", "includes", "including", "has", "having" and any other variations thereof specify the presence of the stated features, integers, steps, operations, elements, and/or components, but do not preclude the presence or addition of one or more other features, integers, steps, operations, elements, components, and/or groups thereof.

While the present disclosure has been described with reference to example embodiments thereof, it will be apparent to those of ordinary skill in the art that various changes and modifications may be made thereto without departing from the scope of the present disclosure as set forth in the following claims.

What is claimed is:

1. A memory device comprising:
   a memory cell array that includes a plurality of memory blocks;
   a sense amplifier connected to the plurality of memory blocks, and configured to perform an offset compensating operation in response to an offset compensation signal; and
   an offset time adjustment circuit connected to the sense amplifier, and configured to adjust an execution time of the offset compensating operation based on a comparison result of a voltage at an equalization voltage node and a reference offset voltage.

2. The memory device of claim 1, wherein the sense amplifier comprises:
   a bit line sense amplifier that includes a sensing bit line and a complementary sensing bit line, the bit line sense amplifier configured to sense a voltage change between a bit line and a complementary bit line in response to a first sensing control signal and a second sensing control signal;
   a first charge transfer transistor configured to electrically connect the bit line to the sensing bit line in response to a charge transfer signal; and
   a second charge transfer transistor configured to electrically connect the complementary bit line to the complementary sensing bit line in response to the charge transfer signal.

3. The memory device of claim 2, wherein the bit line sense amplifier comprises:
   a first transistor configured to electrically connect the sensing bit line to the complementary sensing bit line based on a first equalization signal; and
   a second transistor configured to electrically connect the complementary sensing bit line to the equalization voltage node based on a second equalization signal.

4. The memory device of claim 3, wherein the offset time adjustment circuit comprises:
   a conjunction circuit configured to provide an input voltage and a precharge voltage to the equalization voltage node; and
   a comparison circuit configured to adjust a transition time of the offset compensation signal based on the comparison result of the voltage at the equalization voltage node and the reference offset voltage.

5. The memory device of claim 4, wherein the conjunction circuit comprises:
   a third transistor configured to provide the input voltage to the equalization voltage node in response to an input voltage application signal;
   a fourth transistor configured to provide the precharge voltage to the equalization voltage node in response to a precharge signal; and
   a fifth transistor configured to electrically connect a gate of the first charge transfer transistor and a gate of the second charge transfer transistor to the equalization voltage node in response to the offset compensation signal.

6. The memory device of claim 5, wherein, when the offset compensating operation is performed, the first transistor, the second transistor, the third transistor, and the fifth transistor are turned on.

7. The memory device of claim 5, wherein the comparison circuit comprises:
   a comparator connected to the equalization voltage node, and configured to determine the comparison result by comparing the voltage at the equalization voltage node and the reference offset voltage; and
   a driver configured to determine the transition time of the offset compensation signal based on the comparison result of the comparator.

8. The memory device of claim 7, wherein, when the voltage at the equalization voltage node is equal to the reference offset voltage, the comparator is configured to generate an offset compensation off signal, and
   wherein, in response to the offset compensation off signal, the driver is configured to set the offset compensation signal to logic low such that the fifth transistor is turned off.

9. The memory device of claim 5, wherein the conjunction circuit further comprises:
   a sixth transistor configured to provide a transfer gate voltage to the gate of the first charge transfer transistor and the gate of the second charge transfer transistor in response to a charge transfer (CT) control signal; and a seventh transistor configured to provide an isolation voltage to the gate of the first charge transfer transistor and the gate of the second charge transfer transistor in response to a restore (RST) control signal.

10. The memory device of claim 9, wherein the conjunction circuit further comprises:

an eighth transistor connected between the sixth transistor and a ground voltage, and configured to provide the ground voltage to the gate of the first charge transfer transistor and the gate of the second charge transfer transistor in response to a CT off signal.

11. The memory device of claim 10, wherein the comparison circuit comprises:

a comparator connected to the equalization voltage node, and configured to determine the comparison result by comparing the voltage at the equalization voltage node and the reference offset voltage;

a first driver configured to determine a turn-off time of the fifth transistor based on the comparison result of the comparator; and a second driver configured to determine a turn-on time of the eighth transistor based on the comparison result of the comparator.

12. The memory device of claim 1, further comprising:

a variable voltage generator configured to generate the reference offset voltage, wherein the sense amplifier includes a plurality of transistors, and wherein the variable voltage generator includes a replica transistor that corresponds to at least one of the plurality of transistors included in the sense amplifier.

13. The memory device of claim 12, wherein the variable voltage generator further comprises:

a low-dropout (LDO) regulator configured to generate the reference offset voltage based on a reference normal mode voltage and a threshold voltage of the replica transistor.

14. The memory device of claim 12, wherein the variable voltage generator further comprises:

a first low-dropout (LDO) regulator configured to generate the reference offset voltage and a reference transfer gate voltage; and a second LDO regulator configured to generate a transfer gate voltage based on the reference transfer gate voltage.

15. A memory device comprising:

a memory cell array that includes a plurality of memory blocks;

a sense amplifier connected to the plurality of memory blocks, and configured to perform an offset compensating operation in response to an offset compensation signal;

an offset time adjustment circuit connected to the sense amplifier, and configured to adjust an execution time of the offset compensating operation based on a comparison result of a voltage at an equalization voltage node and a reference offset voltage; and a variable voltage generator configured to generate the reference offset voltage.

16. The memory device of claim 15, wherein the variable voltage generator comprises:

a replica transistor corresponding to at least one of a plurality of transistors included in the sense amplifier, a low-dropout (LDO) regulator configured to generate the reference offset voltage based on a reference normal mode voltage and a threshold voltage of the replica transistor, and wherein the reference normal mode voltage comprises a voltage of a bit line when the offset compensating operation has ended or a voltage of a complementary bit line when the offset compensating operation has ended.

17. The memory device of claim 15, wherein the sense amplifier comprises:

a first charge transfer transistor configured to electrically connect a bit line to a sensing bit line in response to a charge transfer signal;

a second charge transfer transistor configured to electrically connect a complementary bit line to a complementary sensing bit line in response to the charge transfer signal;

a first transistor configured to electrically connect the sensing bit line to the complementary sensing bit line based on a first equalization signal; and a second transistor configured to electrically connect the complementary sensing bit line to the equalization voltage node based on a second equalization signal, and wherein the offset time adjustment circuit comprises:

a third transistor configured to provide an input voltage to the equalization voltage node in response to an input voltage application signal;

a fourth transistor configured to provide a precharge voltage to the equalization voltage node in response to a precharge signal;

a fifth transistor configured to electrically connect a gate of the first charge transfer transistor and a gate of the second charge transfer transistor to the equalization voltage node in response to the offset compensation signal;

a comparator connected to the equalization voltage node, and configured to determine the comparison result by comparing the voltage at the equalization voltage node and the reference offset voltage; and a driver configured to determine a turn-off time of the fifth transistor based on the comparison result of the comparator.

18. The memory device of claim 17, wherein the offset time adjustment circuit further comprises:

a sixth transistor configured to provide a transfer gate voltage to the gate of the first charge transfer transistor and the gate of the second charge transfer transistor in response to a charge transfer (CT) control signal;

a seventh transistor configured to provide an isolation voltage to the gate of the first charge transfer transistor and the gate of the second charge transfer transistor in response to a restore (RST) control signal; and an eighth transistor connected between the sixth transistor and a ground voltage, and configured to provide the ground voltage to the gate of the first charge transfer transistor and the gate of the second charge transfer transistor in response to a CT off signal.

19. A memory device comprising:

a memory cell array that includes a plurality of memory blocks;

a sense amplifier that includes a first charge transfer transistor and a second charge transfer transistor, wherein the sense amplifier is electrically connected to the memory cell array through the first charge transfer transistor and the second charge transfer transistor;

a conjunction circuit connected to the sense amplifier, and configured to provide an input voltage and a transfer gate voltage to a gate of the first charge transfer transistor and a gate of the second charge transfer transistor, wherein the input voltage is used in an operation to compensate for a difference between threshold voltages of one or more elements included in the sense amplifier, and wherein the transfer gate voltage is used in a charge transfer operation; and a variable voltage generator that includes a replica transistor corresponding to at least one of a plurality of transistors included in the sense amplifier, the variable voltage generator configured to generate the transfer gate voltage based on a threshold voltage of the replica transistor.

20. The memory device of claim 19, wherein the variable voltage generator further comprises:

a first low-dropout (LDO) regulator configured to generate a reference transfer gate voltage based on a reference normal mode voltage and the threshold voltage of the replica transistor; and a second LDO regulator configured to generate the transfer gate voltage based on the reference transfer gate voltage.

\* \* \* \* \*